(12) United States Patent
Kobayashi

(10) Patent No.: US 7,597,968 B2
(45) Date of Patent: Oct. 6, 2009

(54) SUBSTRATE FOR PATTERN FORMATION

(75) Inventor: Yoshihiro Kobayashi, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 412 days.

(21) Appl. No.: 11/271,236

(22) Filed: Nov. 10, 2005

(65) Prior Publication Data

US 2006/0099452 A1    May 11, 2006

(30) Foreign Application Priority Data

Nov. 11, 2004    (JP)    ............................ 2004-328188

(51) Int. Cl.
H01L 51/54    (2006.01)
B32B 19/00    (2006.01)

(52) U.S. Cl. .................. 428/690; 428/917; 313/504; 313/506

(58) Field of Classification Search ................ 428/690, 428/917; 313/502–509
See application file for complete search history.

(56) References Cited

U.S. PATENT DOCUMENTS

| 5,900,645 | A | 5/1999 | Yamada | |
|---|---|---|---|---|
| 6,294,313 | B1 * | 9/2001 | Kobayashi et al. | .......... 430/302 |
| 6,573,650 | B2 * | 6/2003 | Aoki et al. | ................... 313/503 |
| 2003/0127969 | A1 | 7/2003 | Aoki et al. | |
| 2003/0193624 | A1 | 10/2003 | Kobayashi et al. | |

FOREIGN PATENT DOCUMENTS

| EP | 1376224 A1 | 1/2004 |
|---|---|---|
| JP | 2000-223270 | 8/2000 |
| JP | 2000-353594 | 12/2000 |
| JP | 2002-022933 | 1/2002 |
| JP | 2003-121384 | * 4/2003 |
| JP | 2003332080 A | 11/2003 |

OTHER PUBLICATIONS

Machine Translation of JP 2003-121384 (Apr. 2003).*

* cited by examiner

*Primary Examiner*—Dawn Garrett
(74) *Attorney, Agent, or Firm*—Ladas & Parry LLP

(57) ABSTRACT

A substrate for pattern formation, which includes a base material, a wettability inhibition part formed in a functional part formation region to be provided with a functional part on the base material, and a wettability inhibition examining part formed in a functional part non formation region without the functional part provided on the bases material is provided. The same constituent materials are used for the wettability inhibition part and the wettability inhibition examining part.

6 Claims, 4 Drawing Sheets

SUBSTRATE FOR PATTERN FORMATION

BACKGROUND OF THE INVENTION

1. Field of the Invention

The present invention relates to a substrate for pattern formation used for patterning various functional parts such as the organic EL layer of the organic EL element and the colored layer of the color filter.

2. Description of the Related Art

Conventionally, as the method of producing a pattern formed body, a method of a liquid repellent process of the partition wall surface after forming a lyophilic partition wall, and a method of carrying out a lyophilic process of the pattern formed portion after forming a liquid repellent partition wall are established. As the former method, for example as it is disclosed in Japanese Patent Application Laid Open (JP-A) No. 2000-353594, there is a method of carrying out the plasma irradiation with a gas containing a fluorine atom introduced. As the latter method, for example as it is disclosed in JP-A No. 2002-22933, there is a method of providing a protection film to a liquid repellent partition wall and carrying out a lyophilic process with an ultraviolet ray irradiation, an oxygen plasma or the like.

However, the method disclosed in JP-A No. 2000-353594 had a problem that a liquid repellent process using the fluorine gas allowed the gas to adhere to all the organic substance so that selections in materials to form an insulation layer was narrowed. Furthermore, the method disclosed in JP-A No. 2002-22933 had a problem that productivity thereof was poor because of an additional process of forming a protection film.

In order to solve the problems, for example, JP-A No. 2000-223270 proposes a method of forming a wettability changeable layer containing a photocatalyst so as to have the wettability change by the action of the photocatalyst according to the energy irradiation, and forming a pattern according to the wettability difference on the wettability changeable layer surface by the pattern exposure to the wettability changeable layer. This method is advantageous in that the labor required for the patterning operation can dramatically be reduced. However, depending on a kind of the base material and other members to be the base of the wettability changeable layer, the wettability change by the photocatalyst action accompanied by the energy irradiation is restrained so that there is a problem of the patterning characteristic decline. Thus, a method of examine the wettability change of the wettability changeable layer surface was sought for.

However, since the above-mentioned wettability changeable layer is in general colorless and transparent, it has been difficult to examine the wettability change in the region for forming for example a colored layer of a color filter, an organic EL layer of an organic electroluminescent (hereinafter it may be abbreviated as EL) element, or the like. For example, without coating a coating solution to be used for forming the colored layer or organic EL layer, whether or not the desired wettability difference has been obtained cannot be confirmed. Moreover, since the pattern by the wettability difference in general is fine, examination has been difficult. Furthermore, since it is examined after the formation of the colored layer or organic EL layer, or the like, defect goods are also colored, EL layers or the like are formed thereon wastefully so that the problem of the production cost has been involved.

SUMMARY OF THE INVENTION

The present invention has been achieved in view of the above-mentioned problems, and the main object is to provide a substrate for pattern formation capable of easily examining the wettability change, and a patterning substrate.

In order to achieve the object, the present invention provides a substrate for pattern formation comprising a base material, a wettability inhibition part formed in a functional part formation region to be provided with a functional part on the base material, and a wettability inhibition examining part formed in a functional part non formation region without the functional part provided on the base material, wherein the same constituent materials are used for the wettability inhibition part and the wettability inhibition examining part.

According to the present invention, since the wettability inhibition examining part is formed in the functional part non formation region, in the case the wettability inhibition part, which is considered to influence the wettability change of the wettability changeable layer is formed at the time of use for a pattern formed body, is formed, the contact angle with respect to a liquid of the wettability changeable layer surface of the functional part non formation region can be measured preliminarily. Thereby, at the time of producing a functional element using the pattern formed body, whether or not the contact angle with respect to a liquid is appropriate can be examined before formation of the functional part on the wettability changeable layer. Moreover, instead of measuring the contact angle with respect to a liquid in the fine pattern, the wettability changeable layer surface provided in the other portion is the examination subject. Thus, the contact angle with respect to a liquid can be measured easily. Furthermore, in the case the contact angle with respect to a liquid is insufficient, or the like, the contact angle with respect to a liquid can be lowered by re-irradiating the energy in a pattern to the wettability changeable layer. Accordingly, since whether or not the contact angle with respect to a liquid is appropriate can be examined before forming the functional part on the wettability changeable layer by using the substrate for pattern formation of the present invention, abandonment of the pattern formed body after the functional part formation can be avoided to reduce the production cost and the abandoned products.

The present invention provides a patterning substrate comprising the substrate for pattern formation, and a wettability changeable layer formed on the wettability inhibition part and the wettability inhibition examining part of the substrate for pattern formation so as to have the wettability change by the action of the photocatalyst accompanied by the energy irradiation.

According to the present invention, the production cost and the abandoned products can be reduced by using the substrate for pattern formation mentioned above. Moreover, since the wettability changeable layer is provided, the wettability of the wettability changeable layer can be changed by exciting the photocatalyst by the energy irradiation so that the wettability changeable pattern can be formed easily. Therefore, a patterning substrate capable of forming the various functional parts, such as an organic EL layer of an organic EL element and a colored layer of a color filter can be provided utilizing wettability difference of the wettability changeable pattern.

In the invention, it is preferable that the wettability changeable layer contains an organopolysiloxane. Since the liquid repellency of the energy unirradiated portion of the wettability changeable layer can be dramatically improved by containing the organopolysiloxane, in the case of providing an organic EL element using a patterning substrate of the present invention, film formation of the organic EL layer in the liquid repellent region can be prevented so that the film formation of the organic EL layer can be enabled only in the lyophilic region as the energy irradiated portion so as to improve the patterning characteristics.

In the present invention, the wettability changeable layer may contain a photocatalyst. Since the wettability of the wettability changeable layer can be changed by the action of the photocatalyst contained in the wettability changeable layer itself, the wettability can be changed efficiently with a small number of production steps.

Moreover, the present invention provides a functional element comprising the patterning substrate and a functional part formed in the functional part formation region on the wettability changeable layer of the patterning substrate.

According to the present invention, by using the above-mentioned patterning substrate, the wettability changeable pattern with the wettability changed can be formed so that the functional part can be formed easily utilizing the wettability difference of the wettability changeable pattern. Moreover, since the patterning substrate is used, the contact angle with respect to a liquid in the lyophilic region of the wettability changeable pattern can be optimized before formation of the functional part so that a functional element with a good yield can be provided.

Furthermore, the present invention provides an organic EL element, wherein the functional part is an organic EL layer comprising at least a light emitting layer.

According to the present invention, the organic layer can easily be painted differently, or the like utilizing the wettability difference of the above-mentioned wettability changeable pattern so that a highly precise organic EL layer can be formed. Moreover, according to the present invention, since the contact angle with respect to a liquid in the lyophilic region of the wettability changeable pattern can be optimized before formation of the organic EL layer so that abandonment after formation of the organic EL layer can be avoided, and thus it is advantageous in terms of the cost.

In the invention, it is preferable that the wettability inhibition part and the wettability inhibition examining part include an insulation layer. In general, according to an organic EL element, an electrode layer is formed on a base material and an insulation layer is formed so as to cover the end portion of the electrode layer. Unless the wettability in the energy irradiated portion of the wettability changeable layer formed on the insulation layer is sufficiently lowered, the thickness of the end portion of the organic EL layer formed on the wettability changeable layer becomes thin so as to cause the short circuit between the electrodes. On the other hand, according to the present invention, since the contact angle with respect to a liquid of the wettability changeable layer surface can be measured preliminarily, formation of the thin organic layer can be avoided so as to prevent the short circuit between the electrodes.

The present invention, moreover, provides a method of producing a pattern formed body comprising: a wettability inhibition part forming step of forming a wettability inhibition part in a functional part formation region to be provided with a functional part on a base material, and a wettability inhibition examining part in a functional part non formation region without a functional part on the base material, a wettability changeable layer forming step of forming a wettability changeable layer to have the wettability change by the action of the photocatalyst accompanied by the energy irradiation on the base material with the wettability inhibition part and the wettability inhibition examining part formed, an energy directing step of forming a wettability changeable pattern with the wettability of the wettability changeable layer changed by directing an energy in a pattern to the wettability changeable layer so as to change the wettability in the wettability changeable layer in the contact angle measuring region for measuring the contact angle with respect to a liquid in the functional part formation region and apart of the functional part non formation region, and an examining step of measuring the contact angle with respect to a liquid of the wettability changeable layer surface of the contact angle measuring region.

According to the present invention, since an examining step is provided, the exposing amount in the energy irradiating step can be optimized before formation of the functional part on the wettability changeable layer, and furthermore, the exposure irregularity, the film thickness irregularity of the wettability changeable layer, or the like can be examined. Therefore, an inexpensive production method which is excellent in step administration with a small amount of abandoned substances can be provided. Moreover, a pattern formed body capable of forming various functional parts such as the organic EL layer of the organic EL element and the colored layer of the color filter can be easily produced utilizing the wettability difference of the wettability changeable pattern obtained in the energy irradiating step.

In the energy directing step of the present invention, the energy is directed in a pattern so as to change the wettability of the wettability changeable layer in the functional part formation region and the contact angle measuring region after disposing the photocatalyst processing layer of the photocatalyst processing layer side substrate comprising a photocatalyst processing layer containing a photocatalyst and a base body, and the wettability changeable layer with a predetermined gap. According to the arrangement, the wettability can be changed efficiently with a high sensitivity of the photocatalyst.

The present invention further provides a method of producing a functional element comprising: a pattern formed body forming step using the method of producing a pattern formed body mentioned above, and a functional part forming step of forming a functional part in a functional part formation region on the wettability changeable layer of the pattern formed body obtained in the pattern formed body forming step.

According to the present invention, as mentioned above since the contact angle with respect to a liquid in the lyophilic region of the wettability pattern can be optimized in the pattern formed body forming step, cost down can be enabled without waste of forming the functional part in a defect product. Moreover, since the wettability changeable pattern with the wettability changed is formed in the above-mentioned pattern formed body, the functional part can be formed easily utilizing the wettability difference of the wettability changeable pattern.

The present invention also provides a method of producing an organic EL element using the method of producing a functional element, wherein the functional part forming step in the method of producing a functional element is an organic EL layer forming step of forming an organic EL layer having at least a light emitting layer.

According to the present invention, since the above-mentioned method of producing the functional element is used, the yield can be improved. Moreover, the organic EL layer can be easily painted differently utilizing the wettability difference of the wettability changeable pattern of the pattern formed body mentioned above so that an organic EL element with a highly precise organic EL layer formed can be produced.

According to the present invention, the contact angle with respect to a liquid in the wettability changeable layer surface can be optimized before formation of the functional part on the wettability changeable layer. Therefore, the effect of providing a functional element such as an organic EL element and a color filter inexpensively with the excellent step administration and a small amount of the waste substances can be achieved.

DETAILED DESCRIPTION OF THE INVENTION

Hereinafter, a substrate for pattern formation, a patterning substrate, a functional element using the same and an organic EL element of the present invention will be explained in detail. Furthermore, a method of producing a pattern formed body, a method of producing a functional element using the same and a method of producing an organic EL element will be explained.

A. Substrate for Pattern Formation

The substrate for pattern formation of the present invention comprising a base material, a wettability inhibition part formed in a functional part formation region to be provided with a functional part on the base material, and a wettability inhibition examining part formed in a functional part non formation region without the functional part provided on the base material, wherein the same constituent materials are used for the wettability inhibition part and the wettability inhibition examining part.

Figure 1:
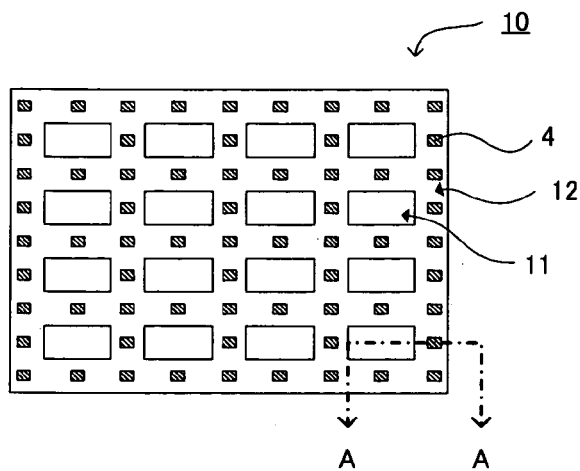
FIG. 1 is a schematic plan view showing an example of a substrate for pattern formation of the present invention.
Figure 2:
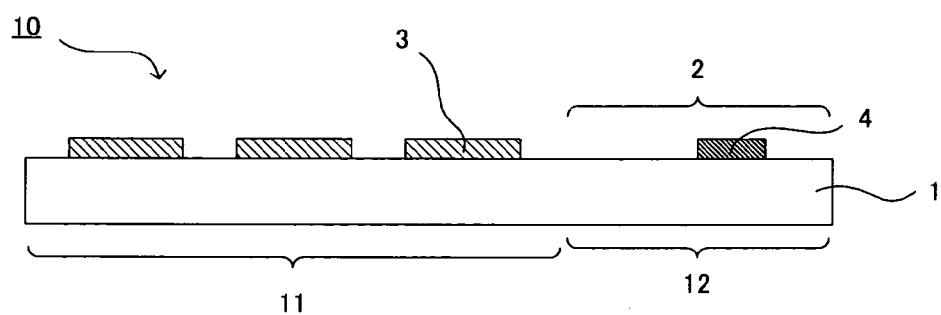
FIG. 2 is a schematic cross-sectional view in the A-A line arrow cross-section shown in FIG. 1.

First, a substrate for pattern formation of the present invention will be explained with reference to the drawings. FIG. 1 is a schematic plan view showing an example of a substrate for pattern formation of the present invention. Moreover, FIG. 2 is a schematic cross-sectional view in the A-A line arrow cross-section shown in FIG. 1. As shown in FIG. 2, a substrate for pattern formation 10 of the present invention includes a wettability inhibition part 3 and a wettability inhibition examining part 4 formed on a base material 1. The wettability inhibition examining part 4 is formed in a functional part non formation region 12, and the wettability inhibition part 3 is formed in a functional part formation region 11. Moreover, the same constituent material is used for the wettability inhibition part 3 and the wettability inhibition examining part 4. At the time, the region with the wettability inhibition examining part 4 formed and the region in the vicinity thereof are provided as a contact angle measuring region 2 for measuring the contact angle with respect to a liquid. In FIG. 1, the wettability inhibition part and the contact angle measuring region are omitted.

Figure 3:
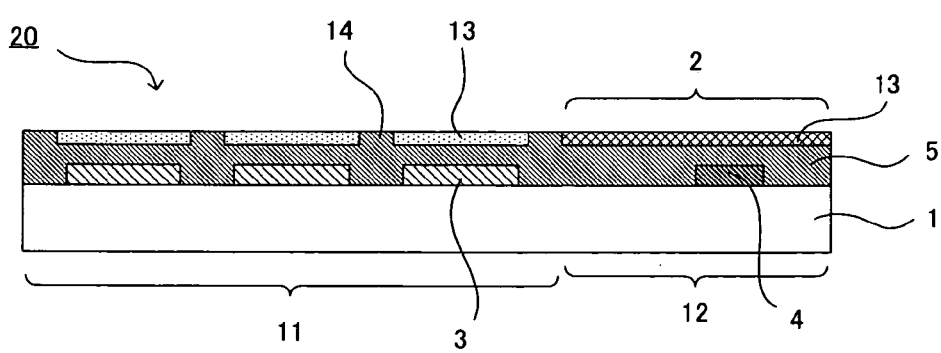
FIG. 3 is a schematic cross-sectional view showing an example of a pattern formed body using a patterning substrate of the present invention.

In the case of using such a substrate for pattern formation is used for a pattern formed body, for example as shown in FIG. 3, the wettability changeable layer 5 to have the wettability change by the action of the photocatalyst accompanied by the energy irradiation is formed on the wettability inhibition part 3 and the wettability inhibition examining part 4 of the substrate for pattern formation, and the wettability changeable pattern including the lyophilic regions 13, 13' and the liquid repellent region 14 is formed on the surface of the wettability changeable layer 5.

Figure 4:
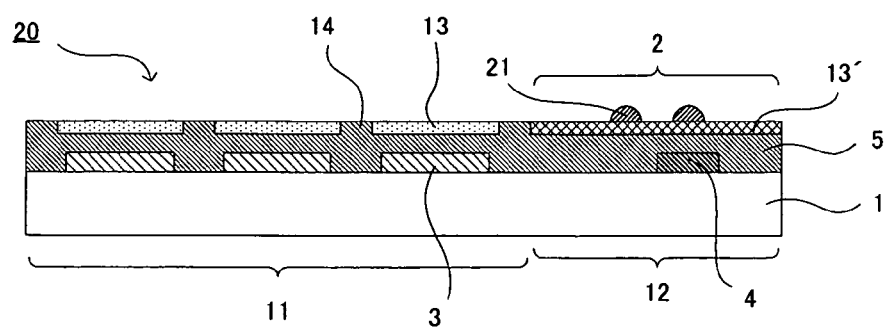
FIG. 4 is an explanatory diagram for explaining the wettability inhibition examining part.

Generally, in the pattern formed body, only the region to form the functional part on the wettability changeable layer surface is provided as the lyophilic region, however, according to the pattern formed body using the substrate for pattern formation of the present invention, the contact angle measuring region 2 on the surface of the wettability changeable layer 5 is provided also as the lyophilic region 13'. According to the configuration, for example as shown in FIG. 4, by adhering an examination liquid 21 only in the lyophilic region 13' using a micro syringe, or the like, the contact angle with respect to a liquid in the lyophilic region 13' can be measured. Thereby, whether or not the contact angle with respect to a liquid in the lyophilic region is appropriate can be examined before formation of the functional part such as the organic EL layer of the organic EL element and the colored layer of the color filter.

Moreover, although whether or not the contact angle with respect to a liquid is appropriate can be examined also by measuring the contact angle with respect to a liquid in the lyophilic region 13, since the organic EL layer of the organic EL element, the colored layer of the color filter, or the like need a highly precise pattern, it is difficult to measure the contact angle with respect to a liquid in the lyophilic region to have the highly precise pattern. According to the present invention, since the contact angle measuring region is provided so that the contact angle with respect to a liquid in the lyophilic region formed in the region can be measured, the contact angle with respect to a liquid can be measured easily.

Furthermore, in the case the contact angle with respect to a liquid is insufficient in the lyophilic region, or the like, the contact angle with respect to a liquid in the lyophilic region can be lowered by re-irradiating the energy in a pattern to the wettability changeable layer.

Accordingly, in the pattern formed body using the substrate for pattern formation of the present invention, it is possible to optimize the contact angle with respect to a liquid in the lyophilic region. Thus, abandonment of the pattern formed body after the functional part formation can be avoided to reduce the production cost and the abandoned products.

Moreover, according to the present invention, the constituent material of the wettability inhibition part is the same as that of the wettability inhibition examining part. For example in FIG. 3, the constituent material of the wettability inhibition part 3 and the constituent material of the wettability inhibition examining part 4 are same as mentioned above. Here, for example as shown in FIG. 3, in the case of providing the pattern formed body 20 using the substrate for pattern formation of the present invention, at the time of changing the wettability of the surface of the wettability changeable layer 5 by the action of the photocatalyst accompanied by the energy irradiation, the base material 1 to be the base and the wettability inhibition part 3 may influence the wettability change. Therefore, for accurately examining the contact angle with respect to a liquid, the layer configuration of the lyophilic region 13 and the layer configuration of the contact angle measuring region 2 should be the same. In FIG. 3, since the lyophilic region 13 includes a region with the base material 1, the wettability inhibition part 3 and the wettability changeable layer 5 laminated, and a region with the base material 1 and the wettability changeable layer 5 laminated, the contact angle measuring region 2 should include a region with the base material 1, the wettability inhibition examining part 4 made of the constituent material of the wettability inhibition part 3 and the wettability changeable layer 5 laminated, and a region with the base material 1 and the wettability changeable layer 5 laminated. Therefore, the constituent material of the wettability inhibition part and the constituent material of the wettability inhibition examining part are the same.

Hereinafter, each configuration of the substrate for pattern formation of the present invention will be explained.

1. Wettability Inhibition Examining Part

The wettability inhibition examining part used in the present invention is formed in the functional part non formation region on the base material. Moreover, the region with the wettability inhibition examining part formed is provided as the contact angle measuring region for measuring the contact angle with respect to a liquid.

In the present invention, the constituent material of the wettability inhibition part is the same as that of the wettability inhibition examining part. The material used for the wettability inhibition examining part will be appropriately selected in accordance with the kind, usage, and the like of the substrate for pattern formation.

For example, at the time of using the substrate for pattern formation of the present invention for an organic EL element, in the case the electrode layer is formed as the wettability inhibition part 3 as shown in FIG. 3, the constituent material of the electrode layer is used for the wettability inhibition examining part 4.

Figure 5:
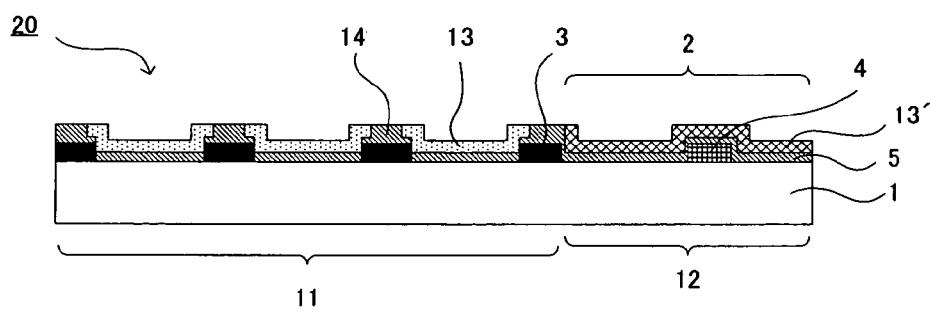
FIG. 5 is a schematic cross-sectional view showing another example of a pattern formed body using a patterning substrate of the present invention.

Moreover, for example at the time of using the substrate for pattern formation of the present invention for a color filter, in the case the light shielding part is formed as the wettability inhibition part 3 as shown in FIG. 5, the constituent material of the light shielding part is used for the wettability inhibition examining part 4.

The above-mentioned wettability inhibition examining part is formed in the functional part non formation region on the base material according to the formation position of the wettability inhibition part. As mentioned above, in order to accurately measure the contact angle with respect to a liquid, the layer configuration of the lyophilic region 13 and the layer configuration of the contact angle measuring region 2 should be the same. For example as shown in FIGS. 3 and 5, in the case the wettability inhibition part 3 is formed in the lyophilic region 13, the wettability inhibition examining part 4 is formed in the contact angle measuring region 2.

Moreover, at the time of providing the pattern formed body using the substrate for pattern formation of the present invention, in order to examine whether or not the contact angle with respect to a liquid in the lyophilic region on the wettability changeable layer surface is appropriate, at least one wettability inhibition examining part needs to be formed. It is preferable that the wettability inhibition examining part is formed for each functional part formation region. Thereby, exposure irregularity at the time of the energy irradiation, or the like can be examined. Moreover, a plurality of the wettability inhibition examining parts may be formed in the periphery of the functional part formation region. However, in the case the wettability inhibition examining part is formed in too many points, the examination of measuring the contact angle with respect to a liquid becomes complicated, and thus the number of the formed wettability inhibition examining parts may be selected in consideration to the examination efficiency.

Furthermore, the size of the wettability inhibition examining part is not particularly limited as long as it is a size capable of being formed in a part of the functional part non formation region and capable of measuring the contact angle with respect to a liquid in the lyophilic region on the wettability changeable layer surface. Moreover, also the shape of the wettability inhibition examining part is not particularly limited.

As for the thickness of the wettability inhibition examining part, it is preferable to have the same thickness as that of the wettability inhibition part. According to the present invention, for example as shown in FIG. 4, since the contact angle with respect to a liquid in the lyophilic region 13' to be the contact angle measuring region 2 is measured and examined for the purpose of confirming whether or not the contact angle with respect to a liquid in the lyophilic region 13 is appropriate, by providing the wettability inhibition examining part 4 and the wettability inhibition part 3 by the same thickness, the conditions at the time of the wettability change can be provided same so as to enable the further accurate examination. Moreover, since the thicknesses of the wettability inhibition examining part and the wettability inhibition part are the same, they can be patterned simultaneously at the time of forming the wettability inhibition examining part and the wettability inhibition part without increasing an extra step of forming the wettability inhibition examining part.

2. Contact Angle Measuring Region

The contact angle measuring region of the present invention is provided for measuring the contact angle with respect to a liquid. As long as it is formed in a part of the functional part non formation region, the formation position thereof is not particularly limited.

Moreover, at the time of providing the pattern formed body using the substrate for pattern formation of the present invention, in order to examine whether or not the contact angle with respect to a liquid in the lyophilic region on the wettability changeable layer surface is appropriate, at least one contact angle measuring region needs to be formed in a part of the functional part non formation region. It is preferable that the contact angle measuring region is formed for each functional part formation region. Thereby, exposure irregularity at the time of the energy irradiation, or the like can be examined. Moreover, a plurality of the contact angle measuring regions may be formed in the periphery of the functional part formation region. However, in the case the contact angle measuring region is formed in too many points, the examination of measuring the contact angle with respect to a liquid becomes complicated, and thus the number of the formed contact angle measuring regions may be selected in consideration to the examination efficiency.

Furthermore, the size of the contact angle measuring region is not particularly limited as long as it is a size capable of being formed in a part of the functional part non formation region and capable of measuring the contact angle with respect to a liquid in the lyophilic region on the wettability changeable layer surface. Moreover, also the shape of the contact angle measuring region is not particularly limited.

3. Wettability Inhibition Part

The wettability inhibition part used in the present invention is formed in the functional part formation region on the base material. The wettability inhibition part is not particularly limited as long as it is considered to influence the wettability at the time of providing a pattern formed body using the substrate for pattern formation of the present invention or have the risk thereof. The wettability inhibition part will be appropriately selected in accordance with the kind and usage of the substrate for pattern formation of the present invention.

Hereinafter, specific examples of the wettability inhibition part will be explained.

(1) Light Shielding Part

In the present invention, for example, it is possible that the above-mentioned base material is transparent and a light shielding part is formed on the base material as the wettability inhibition part. Thereby, at the time of providing a pattern formed body using the substrate for pattern formation of the present invention, the energy irradiation can be enabled from the base material side. Moreover, since the wettability of the wettability changeable layer in the region with the light shielding part formed is not changed, a photo mask or the like is not needed and the wettability changeable pattern can be formed in a pattern without formation of the light shielding part.

No especial limitation is imposed on the light shielding part if the part is a part capable of shielding the radiated energy. The method used for forming the light shielding part is appropriately selected in accordance with the power for shielding to the required energy and other factors.

For instance, a metal thin film that is made of chromium or the like and formed into a thickness of about 1000 to 2000 Å by a sputtering method, a vacuum deposition method or the like is formed and patterned to form a shielding part. As the patterning method, an ordinary patterning method such as the sputtering can be used.

A method may be one by which a layer that contains light shielding particles such as carbon particulates, metal oxides, inorganic pigments and organic pigments in a resin binder is formed in a pattern. As the resin binders that can be used, a polyimide resin, acrylic resin, epoxy resin, polyacrylamide, polyvinyl alcohol, gelatin, casein, cellulose and the like can be used singularly or in combination of two or more kinds, and furthermore a photosensitive resin and an O/W emulsion type resin composition such as emulsified reactive silicone can be used. A thickness of such the resinous light shielding part can be set in the range of 0.5 to 10 µm. As a method of patterning such the resinous light shielding part, methods such as a photolithography method and a printing method that are generally used can be used.

Moreover, the light shielding part may be formed by the thermal transfer method. According to the thermal transfer method for forming the light shielding part in general, a light shielding part is formed by disposing on a base material a thermal transfer sheet with a photo thermal conversion layer and a light shielding part transfer layer provided on one side of a transparent film base material, and directing an energy to the area for forming the light shielding part so as to transfer the light shielding part transfer layer onto the base material. The film thickness of the light shielding part to be formed by the thermal transfer method is in general 0.5 µm to 10.0 µm, and in particular about 0.8 µm to 5.0 µm.

The light shielding part to be transferred by the thermal transfer method in general comprises a light shielding material and a binding agent. As the light shielding material, inorganic particles of a carbon black, a titanium black, or the like can be used. The particle size of the light shielding material is preferably in a range of 0.01 µm to 1.0 µm, in particular, in a range of 0.03 µm to 0.3 µm.

Moreover, as to the binding agent, it is preferable that it has a resin composition having the thermoplastic property and the thermosetting property, and it is preferable that it has a thermosetting functional group, a resin material having a softening point in a range of 50° C. to 150° C., in particular, 60° C. to 120° C., and a hardening agent, or the like. As such a material, specifically, an epoxy compound having two or more epoxy groups in one molecule, a combination of an epoxy resin and a potential hardening agent thereof, or the like can be presented. Moreover, as the potential hardening agent for an epoxy resin, a hardening agent not showing the reactivity with an epoxy group up to a certain temperature and having the molecular structure change to show the reactivity with the epoxy resin at the time it reaches at the activating temperature by heating can be used. Specifically, a neutral salt or complex of an acidic or basic compound having the reactivity with an epoxy group, a block compound, a high melting point substance, and a micro capsule contained substance can be presented. Moreover, in the light shielding part, in addition to the above-mentioned materials, a mold releasing agent, a bonding auxiliary agent, an antioxidant, a dispersing agent, or the like may be contained.

(2) Electrode Layer

In the case the substrate for pattern formation of the present invention is used for an organic EL element, or the like, an electrode layer may be formed on the base material as the wettability inhibition part.

The electrode layer used may either be an anode or a cathode. Moreover, the electrode layer may either be transparent or not, and it may be selected optionally according to the light taking out surface or the receiving surface, the direction of the energy irradiation when used for the pattern formed body, or the like. At the time of providing an organic El element using a substrate for pattern formation of the present invention, for example in the case of taking out the light beam from the electrode layer side, the electrode layer needs to be transparent or semitransparent.

As the anode, it is preferable to use a conductive material having a large work function for facilitating the positive hole injection. Specifically, a metal having a large work function such as an ITO, an indium oxide, and a gold, a conductive polymer such as a polyaniline, a polyacetylene, a polyalkyl thiophene derivative, and a polysilane derivative, or the like can be presented.

For the cathode, it is preferable to use a conductive material having a small work function for facilitating the electron injection. For example, magnesium alloys such as MgAg, aluminum alloys such as AlLi, AlCa, and AlMg, alkaline metals and alkaline earth metals such as Li and Ca, alloys of the alkaline metals and the alkaline earth metals or the like can be presented.

Moreover, it is preferable that the electrode layer has a small resistance. In general, a metal material is used, however, an organic compound or an inorganic compound may be used as well.

As for the method of forming the electrode layer, a conventional forming method of the electrode can be employed. For example, PVD method such as vacuum deposition method, sputtering method, or ion plating method, or CVD method can be cited. For a patterning method of the electrode layer, there is no particular limitation imposed as long as a desired pattern can be formed precisely, however, photolithography method or the like can be cited as a specific example.

(3) Insulation Layer

Figure 6:
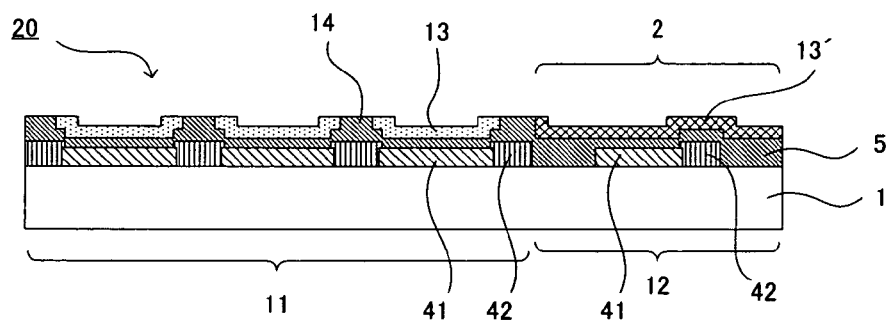
FIG. 6 is a schematic cross-sectional view showing still another example of a pattern formed body using a patterning substrate of the present invention.

In the case the substrate for pattern formation of the present invention is used for an organic EL element, or the like, for example as shown in FIG. 6, insulation layers 42 maybe formed between the above-mentioned electrode layers 41 on the base material 1. In general, the insulation layers 42 are formed so as to cover the end portions of the electrode layers 41. According to the present invention, as mentioned above, the layer configuration of the lyophilic region 13 and the layer configuration of the contact angle measuring region 2 need to be same. Therefore, in FIG. 6, since the electrode layers 41 and the insulation layers 42 are formed as the wettability inhibition part, and the lyophilic region 13 includes a region in which the base material 1, the electrode layers 41, the insulation layers 42 and the wettability changeable layer 5 are laminated, and a region in which the base material 1, the insulation layers 42 and the wettability changeable layer 5 are laminated, the electrode layers 41 and the insulation layers 42 are formed as the wettability inhibition examining part. In the contact angle measuring region 2, a region in which the base material 1, the electrode layers 41, the insulation layers 42 and the wettability changeable layer 5 are laminated, and a region in which the base material 1, the insulation layers 42 and the wettability changeable layer 5 are laminated are formed. Thus, since the lyophilic region 13 includes also a region without formation of the insulation layer 42 on the electrode layer 41, such a layer configuration is provided also in the contact angle measuring region 2. Thereby, whether or not the contact angle with respect to a liquid can be measured preliminarily both for the surface of the wettability changeable layer 5 on the electrode layers 41 and the surface of the wettability changeable layer 5 on the insulation layers 42.

The insulation layer is provided for stopping the charge supply from the electrode layer to the organic EL layer in the case of providing an organic EL element using a substrate for pattern formation of the present invention. Moreover, the portion with the insulation layer formed can be a portion without the light emission.

For such an insulation layer, a photo setting resin such as a photosensitive polyimide resin and an acrylic based resin, a thermosetting resin, an inorganic material, or the like can be used.

Moreover, for a forming method of the insulation layer, those methods known in general, such as the photolithography method or the printing method, can be employed.

(4) Others

In the present invention, the base material itself to be described later may influence the wettability of the wettability changeable layer. Therefore, although it depends on the kind of the base material, the base material may also be the wettability inhibition part.

4. Base Material

The base material used in the present invention is not particularly limited as long as the above-mentioned wettability inhibition examining part, the wettability inhibition part and the wettability changeable layer mentioned in the section of "B. Patterning substrate" to be described later can be formed, and it may be selected optionally according to the kind, the application, or the like of the substrate for pattern formation. Moreover, the transparency and the flexibility may also be selected optionally.

Examples of the base material include a resin-laminated plate having a paper base material, a resin-laminated plate having a glass cloth base or a glass nonwoven cloth base, and ceramic and metallic plates.

B. Patterning Substrate

Next, the patterning substrate of the present invention will be explained. The patterning substrate comprising the substrate for pattern formation mentioned above, and a wettability changeable layer formed on the wettability inhibition part and the wettability inhibition examining part of the substrate for pattern formation so as to have the wettability change by the action of the photocatalyst accompanied by the energy irradiation.

Figure 7A:
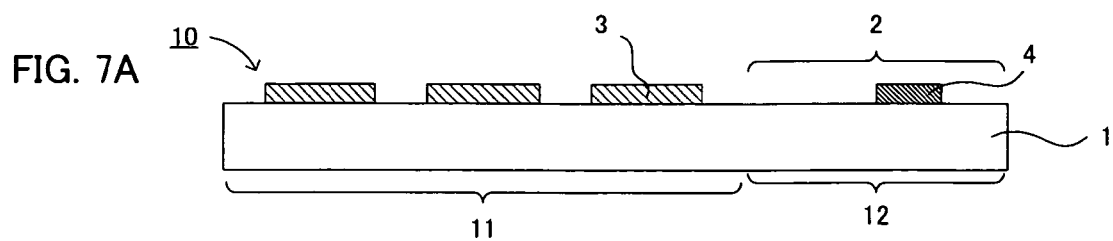
FIG. 7A to 7E is a process diagram showing an example of a method of producing a pattern formed body of the present invention.
Figure 7B:
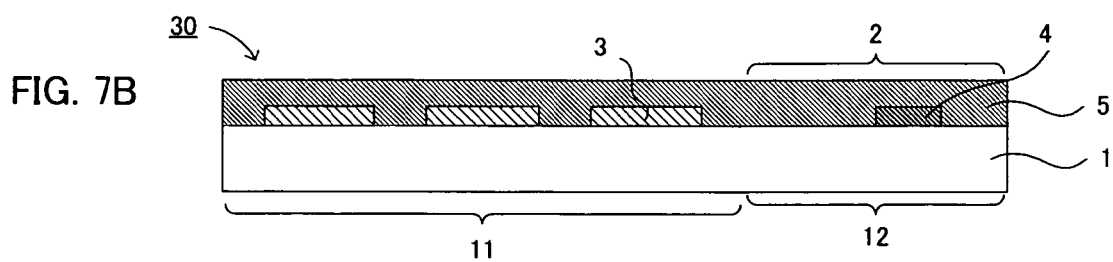
Figure 7C:
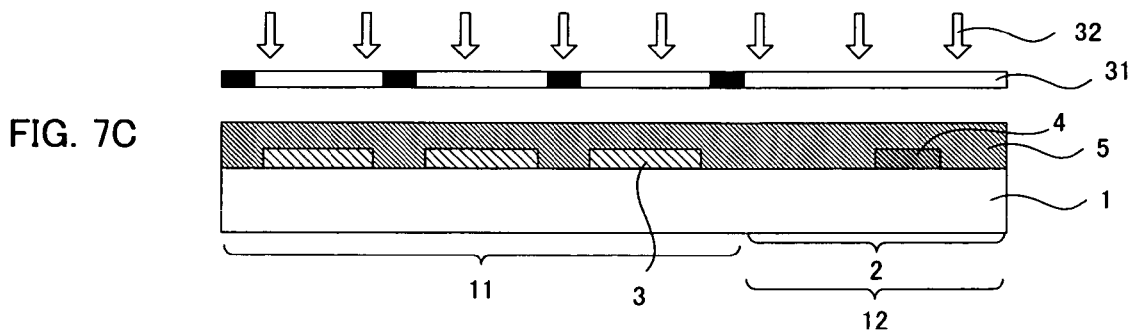
Figure 7D:
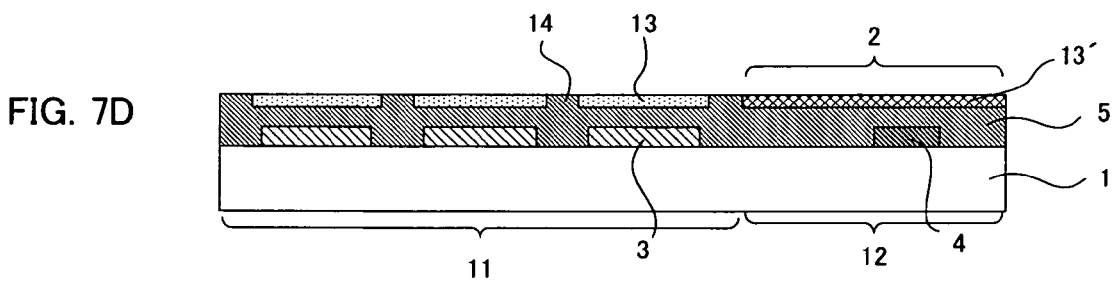

FIG. 7B is a schematic cross-sectional view showing an example of the patterning substrate of the present invention. As shown in FIG. 7B, the patterning substrate 30 of the present invention includes the wettability changeable layer 5 on the wettability inhibition part 3 and the wettability inhibition examining part 4 of the pattern formed body 10 shown in FIG. 7A.

According to the present invention, since the patterning substrate includes the wettability changeable layer, the wettability of the wettability changeable layer can be changed by exciting the photocatalyst by the energy irradiation so as to easily form the wettability changeable pattern. Therefore, by utilizing the wettability difference of the wettability changeable pattern, a patterning substrate capable of forming various functional parts such as the organic EL layer of the organic EL element and the colored layer of the color filter can be formed.

Moreover, since the patterning substrate of the present invention uses the pattern formed body mentioned above, the contact angle with respect to a liquid in the lyophilic region can be optimized before forming the functional part on the wettability changeable layer. Thus, abandonment of the pattern formed body after the functional part formation can be avoided to reduce the production cost and the abandoned products.

Hereinafter, each configuration of the patterning substrate of the present invention will be explained.

1. Wettability Changeable Layer

The wettability changeable layer used in the present invention is formed on the wettability inhibition part and the wettability inhibition examining part of the above-mentioned substrate for pattern formation so as to have the wettability change by the action of the photocatalyst accompanied by the energy irradiation. The wettability changeable layer is not particularly limited as long as the wettability is changed by the action of the photocatalyst accompanied by the energy irradiation. As the preferable embodiments, the case in which a wettability changeable layer contains at least a photocatalyst and a binder, have the wettability change by the action of the photocatalyst accompanied by the energy irradiation as a photocatalyst containing layer (first embodiment), the case in which a wettability changeable layer includes a photocatalyst processing layer containing at least a photocatalyst, and a wettability variable layer formed on the photocatalyst processing layer so as to have the wettability change by the action of the photocatalyst accompanied by the energy irradiation (second embodiment), and the case in which a wettability changeable layer is a wettability variable layer with the wettability changeable layer and a photocatalyst processing layer on the photocatalyst processing layer side substrate having at least a photocatalyst processing layer containing a photocatalyst and a base body disposed with a predetermined gap so as to have the wettability change by the energy irradiation from a predetermined direction (third embodiment) can be presented.

Hereinafter, each embodiment will be explained.

(1) First Embodiment

The wettability changeable layer used in the present embodiment is the photocatalyst containing layer comprises at least a photocatalyst and a binder and the wettability thereof changes by the action of the photocatalyst accompanied by the energy irradiation. Since the photocatalyst containing layer has the wettability change by the action of the photocatalyst contained in the photocatalyst containing layer itself, it is advantageous in that the wettability changeable pattern can be formed efficiently with a small number of production steps.

The photocatalyst containing layer of this embodiment is not particularly limited as long as it is a layer to have the contact angle with respect to a liquid on the surface is lowered by the energy to be directed. By using such a photocatalyst containing layer, the wettability changeable pattern of a lyophilic region having a small contact angle with respect to a liquid can be formed by the energy irradiation. Thereby, for example a functional part forming coating solution used for forming a functional part such as an organic EL layer of an organic EL element and a colored layer of a color filter can be adhered highly precisely in a lyophilic region so that a functional element such as an organic EL element and a color filter can be produced efficiently.

The lyophilic region referred to herein is a region having a small contact angle with a liquid, and is a region having a good wettability to a functional part forming coating solution used for forming a functional part on a manufactured pattern formed body. It is a region having a good wettability to a solution such as an organic EL layer forming coating solution for forming an organic EL layer when the functional element is the organic EL element, a colored layer forming coating solution for forming a colored layer when the functional element is a color filter, or a metallic wiring forming coating solution when the functional element is metallic wiring.

The liquid repellent region, on the other hand, is a region having a large contact angle with a liquid, and is a region having a poor wettability to the above-mentioned functional part forming coating solution.

As for the photocatalyst containing layer used in the present embodiment, in the region not irradiated with energy, that is, in the liquid repellent region, it is preferable to have the contact angle with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more for the following reason: the region not irradiated with the energy is a region for which liquid repellency is required; therefore, in the case that the contact angle with the above-mentioned liquid is small, the liquid repellency is insufficient; and, for example, when an organic EL layer forming coating solution for forming an organic EL layer of organic EL layer element is applied by an ink-jetting method or the like and hardened, the organic EL layer forming coating solution may also adhere onto the liquid repellent region; it therefore becomes difficult to form a functional part such as an organic EL layer, highly precisely.

About the photocatalyst containing layer, in the region irradiated with energy, that is, in the lyophilic region, preferably, the contact angle with a liquid having a surface tension of 40 mN/m is less than 9°, more preferably, the contact angle with a liquid having a surface tension of 50 mN/m is 10° or less, and even more preferably the contact angle with a liquid having a surface tension of 60 mN/m is 10° or less for the following reason: in the case that the contact angle with the liquid is high in the region irradiated with the energy, that is, in the lyophilic region, the lyophilic region also repels, for example, an organic EL layer forming coating solution for forming an organic EL layer of an organic EL element; and, for example, when the organic EL layer forming coating solution is applied by an ink-jetting method, this solution is not sufficiently applied or spread; it therefore becomes difficult to form a functional part, for example, such an organic EL layer.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd). Moreover, at the time of the measurement, as the liquids having the various surface tensions, wetting index standard solution manufactured by JUNSEI CHEMICAL CO., LTD. were used.

According to the photocatalyst containing layer used in the present embodiment, the photocatalyst containing layer may be formed such that a fluorine is contained, and furthermore, the fluorine content of the photocatalyst containing layer surface is lowered at the time of directing an energy to the photocatalyst containing layer according to the action of the photocatalyst compared with the state before the energy irradiation. Moreover, it may be formed including a decomposing substance to be decomposed by the action of the photocatalyst based on the energy irradiation, and thereby changing the wettability on the photocatalyst containing layer.

The action mechanism of the photocatalyst that will be detailed below, a typical example of which is titanium dioxide, in the above-mentioned photocatalyst containing layer is not necessarily clear, but would be as follows: carries generated by radiation of light react directly with adjacent chemical species or are combined with oxygen or active oxygen species generated in the presence of water, so as to change the chemical structure of organic materials.

Moreover, although the thickness of the photocatalyst containing layer differs depending upon the application of the patterning substrate of the present invention, it is preferably in a range of 0.01 to 10 μm. Thereby, a layer having the efficient wettability change can be provided by the action of the photocatalyst in the photocatalyst containing layer.

As the photocatalyst used in the present embodiment, those known as photo semiconductors, such as a titanium dioxide ($TiO_2$), a zinc oxide (ZnO), a tin oxide ($SnO_2$), a strontium titanate ($SrTiO_3$), a tungsten oxide ($WO_3$), a bismuth oxide ($Bi_2O_3$), and an iron oxide ($Fe_2O_3$) can be presented, and one or two or more kinds as a mixture can be selected and used from them.

According to the present embodiment, in particular, a titanium dioxide can be used preferably since it has high band gap energy, it is chemically stable without the toxicity, and it can be obtained easily. The titanium dioxides include those of the anatase type and the rutile type belonging to the tetragonal system and those of the brookite type belonging to the ortho rhombic system. In this embodiment, either one can be used, or furthermore, these can be used as a mixture. Among these, in the present embodiment, it is preferable to use the anatase type titanium dioxide. The anatase type titanium dioxide has a 380 nm or less excitation wavelength.

As the anatase type titanium dioxide, for example, a hydrochloric acid deflocculation type anatase type titania sol (STS-02 (average particle diameter 7 nm) manufactured by ISHIHARA SANGYO KAISHA, LTD., ST-K01 manufactured by ISHIHARA SANGYO KAISHA, LTD.), or a nitric acid deflocculation type anatase type titania sol (TA-15 (average particle diameter 12 nm) manufactured by Nissan Chemical Industries, Ltd.) can be presented.

Moreover, it is known that the brookite type titanium dioxide has a high photocatalyst activity so that it can be used preferably.

With a smaller particle diameter of the photocatalyst, the photocalytic reaction can be generated effectively, and thus it is preferable. An average particle diameter of 200 nm or less is preferable, and use of a photocatalyst of 100 nm or less is particularly preferable.

The photocatalyst content in the photocatalyst containing layer used in the present embodiment can be normally set in a range of 5 to 60% by weight, preferably in a range of 20 to 40% by weight.

It can be confirmed that the photocatalyst is contained in the photocatalyst containing layer by the X ray photoelectron spectrometry, the Rutherford back scattering spectrometry, nuclear magnetic resonance spectrometry, the mass spectrometry or a combination of thereof.

No especial limitation is imposed on the material which changes its wettability by the action of the photocatalyst accompanied by the energy irradiation used in the present embodiment, as long as it is a binder which has a main chain that is not deteriorated or decomposed by action of the photocatalyst. Examples include organopolysiloxanes or the like. Among them, in the present embodiment, it is preferable that the organopolysiloxanes is an organopolysiloxanes containing a fluoroalkyl group.

Examples of such organopolysiloxanes are, for example, (1) an organopolysiloxane which exhibits a large strength and can be obtained by hydrolyzing and polycondensing chloro or alkoxysilane by sol-gel reaction or the like, and (2) an organopolysiloxane obtained by crosslinking a reactive silicone excellent in water repellency or oil repellency.

In the case (1), it is preferably an organopolysiloxane as a hydrolyzed condensation product or a co-hydrolyzed condensation product of one or two or more kinds of silicon compounds represented by the general formula:

$$Y_n SiX_{(4-n)}$$

(Here, Y is an alkyl group, a fluoroalkyl group, a vinyl group, an amino group, a phenyl group, an epoxy group or a group containing them, and X is an alkoxyl group, an acetyl group or a halogen. n is an integer from 0 to 3). Here, the alkoxy group represented by X is preferably a methoxy group, an ethoxy group, a propoxy group, or a butoxy group. Moreover, the number of atoms of the entire group represented by Y is preferably in a range of 1 to 20, in particular, in a range of 5 to 10.

Specifically, a methyl trichloro silane, a methyl tribrom silane, a methyl trimethoxy silane, a methyl triethoxy silane, a methyl triisopropoxy silane, a methyl tri t-butoxy silane; an ethyl trichloro silane, an ethyl tribrom silane, an ethyl trimethoxy silane, an ethyl triethoxy silane, an ethyl triisopropoxy silane, an ethyl tri t-butoxy silane, a n-propyl trichloro silane, a n-propyl tribrom silane, a n-propyl trimethoxy silane, a n-propyl triethoxy silane, a n-propyl triisopropoxy silane, a n-propyl tri t-butoxy silane, a n-hexyl trichloro silane, a n-hexyl tribrom silane, a n-hexyl trimethoxy silane, a n-hexyl triethoxy silane, a n-hexyl triisopropoxy silane, a n-hexyl tri t-butoxy silane, a n-decyl trichloro silane, a n-decyl tribrom silane, a n-decyl trimethoxy silane, a n-decyl triethoxy silane, a n-decyl triisopropoxy silane, a n-decyl tri t-butoxy silane, a n-octadecyl trichloro silane, a n-octadecyl tribrom silane, a n-octadecyl trimethoxy silane, a n-octadecyl triethoxy silane, a n-octadecyl triisopropoxy silane, a n-octadecyl tri t-butoxy silane, a phenyl trichloro silane, a phenyl tribrom silane, a phenyl trimethoxy silane, a phenyl triethoxy silane, a phenyl triisopropoxy silane, a phenyl tri t-butoxy silane, a tetrachloro silane, a tetrabrom silane, a tetramethoxy silane, a tetraethoxy silane, a tetrabutoxy silane, a dimethoxy diethoxy silane, a dimethyl dichloro silane, a dimethyl dibrom silane, a dimethyl dimethoxy silane, a dimethyl diethoxy silane, a diphenyl dichloro silane, a diphenyl dibrom silane, a diphenyl dimethoxy silane, a diphenyl diethoxy silane, a phenyl methyl dichloro silane, a phenyl methyl dibrom silane, a phenyl methyl dimethoxy silane, a phenyl methyl diethoxy silane, a trichloro hydrosilane, a tribrom hydrosilane, a trimethoxy hydrosilane, a triethoxy hydrosilane, a triisopropoxy hydrosilane, a tri t-butoxy hydrosilane, a vinyl trichloro silane, a vinyl tribrom silane, a vinyl trimethoxy silane, a vinyl triethoxy silane, a vinyl triisopropoxy silane, a vinyl tri t-butoxy silane, a trifluoro propyl trichloro silane, a trifluoropropyl tribrom silane, a trifluoropropyl trimethoxy silane, a trifluoro propyl triethoxy silane, a trifluoropropyl triisopropoxy silane, a trifluoro propyl tri t-butoxy silane, a γ-glycidoxy propyl methyl dimethoxy silane, a γ-glycidoxy propyl methyl diethoxy silane, a γ-glycidoxy propyl trimethoxy silane, a γ-glycidoxy propyl triethoxy silane, a γ-glycidoxy propyl triisopropoxy silane, a γ-glycidoxy propyl tri t-butoxy silane, a γ-methacryloxy propyl methyl dimethoxy silane, a γ-methacryloxy propyl methyl diethoxy silane, a γ-methacryloxy propyl trimethoxy silane, a γ-methacryloxy propyl triethoxy silane, a γ-methacryloxy propyl triisopropoxy silane, a γ-methacryloxy propyl tri t-butoxy silane, a γ-amino propyl methyl dimethoxy silane, a γ-amino propyl methyl diethoxy silane, a γ-amino propyl trimethoxy silane, a γ-amino propyl triethoxy silane, a γ-amino propyl triisopropoxy silane, a γ-amino propyl tri t-butoxy silane, a γ-mercapto propyl methyl dimethoxy silane, a γ-mercapto propyl methyl diethoxy silane, a γ-mercapto propyl trimethoxy silane, a γ-mercapto propyl triethoxy silane, a γ-mercapto propyl triisopropoxy silane, a γ-mercapto propyl tri t-butoxy silane, a β-(3,4-epoxy cyclohexyl)ethyl trimethoxy silane, a β-(3,4-epoxy cyclohexyl)ethyl triethoxy silane, a partial hydrolyzed product thereof, and a mixture thereof can be presented.

Thereby, at the time of forming the photocatalyst containing layer, the surface can be provided with the liquid repellent property by the Y comprising the organopolysiloxane. Moreover, according to the action of the photocatalyst accompanied by the energy irradiation, the lyophilic property can be provided by the decomposition of the Y, or the like.

Moreover, since the photocatalyst containing layer before the energy irradiation can have the particularly high liquid repellent property in the case an organopolysiloxane having the Y comprising the organopolysiloxane as a fluoroalkyl group, it is preferable to use an organopolysiloxane having the fluoroalkyl group in the case a high liquid repellent property is required, or the like. As such an organopolysiloxane, specifically, a hydrolyzed condensation product or a co-hydrolyzed condensation product of one or two or more kinds of the below-mentioned fluoroalkylsilanes can be presented. Those known as a fluorine based silane coupling agent can be used.

$CF_3(CF_2)_3CH_2CH_2Si(OCH_3)_3$;
$CF_3(CF_2)_5CH_2CH_2Si(OCH_3)_3$;

CF$_3$(CF$_2$)$_7$CH$_2$CH$_2$Si(OCH$_3$)$_3$;
CF$_3$(CF$_2$)$_9$CH$_2$CH$_2$Si(OCH$_3$)$_3$;
(CF$_3$)$_2$CF(CF$_2$)$_4$CH$_2$CH$_2$Si(OCH$_3$)$_3$;
(CF$_3$)$_2$CF(CF$_2$)$_6$CH$_2$CH$_2$Si(OCH$_3$)$_3$;
(CF$_3$)$_2$CF(CF$_2$)$_8$CH$_2$CH$_2$Si(OCH$_3$)$_3$;
CF$_3$(C$_6$H$_4$)C$_2$H$_4$Si(OCH$_3$)$_3$;
CF$_3$(CF$_2$)$_3$(C$_6$H$_4$)C$_2$H$_4$Si(OCH$_3$)$_3$;
CF$_3$(CF$_2$)$_5$(C$_6$H$_4$)C$_2$H$_4$Si(OCH$_3$)$_3$;
CF$_3$(CF$_2$)$_7$(C$_6$H$_4$)C$_2$H$_4$Si(OCH$_3$)$_3$;
CF$_3$(CF$_2$)$_3$CH$_2$CH$_2$SiCH$_3$(OCH$_3$)$_2$;
CF$_3$(CF$_2$)$_5$CH$_2$CH$_2$SiCH$_3$(OCH$_3$)$_2$;
CF$_3$(CF$_2$)$_7$CH$_2$CH$_2$SiCH$_3$(OCH$_3$)$_2$;
CF$_3$(CF$_2$)$_9$CH$_2$CH$_2$SiCH$_3$(OCH$_3$)$_2$;
(CF$_3$)$_2$CF(CF$_2$)$_4$CH$_2$CH$_2$SiCH$_3$(OCH$_3$)$_2$;
(CF$_3$)$_2$CF(CF$_2$)$_6$CH$_2$CH$_2$SiCH$_3$(OCH$_3$)$_2$;
(CF$_3$)$_2$CF(CF$_2$)$_8$CH$_2$CH$_2$SiCH$_3$(OCH$_3$)$_2$;
CF$_3$(C$_6$H$_4$)C$_2$H$_4$SiCH$_3$(OCH$_3$)$_2$;
CF$_3$(CF$_2$)$_3$(C$_6$H$_4$)C$_2$H$_4$SiCH$_3$(OCH$_3$)$_2$;
CF$_3$(CF$_2$)$_5$(C$_6$H$_4$)C$_2$H$_4$SiCH$_3$(OCH$_3$)$_2$;
CF$_3$(CF$_2$)$_7$(C$_6$H$_4$)C$_2$H$_4$SiCH$_3$(OCH$_3$)$_2$;
CF$_3$(CF$_2$)$_3$CH$_2$CH$_2$Si(OCH$_2$CH$_3$)$_3$;
CF$_3$(CF$_2$)$_5$CH$_2$CH$_2$Si(OCH$_2$CH$_3$)$_3$;
CF$_3$(CF$_2$)$_7$CH$_2$CH$_2$Si(OCH$_2$CH$_3$)$_3$;
CF$_3$(CF$_2$)$_9$CH$_2$CH$_2$Si(OCH$_2$CH$_3$)$_3$;
CF$_3$(CF$_2$)$_7$SO$_2$N(C$_2$H$_5$)C$_2$H$_4$CH$_2$Si(OCH$_3$)$_3$

It can be confirmed that the organopolysiloxane having the fluoroalkyl group is contained in the photocatalyst containing layer by the X ray photoelectron spectrometry, the Rutherford back scattering spectrometry, nuclear magnetic resonance spectrometry, the mass spectrometry or a combination of thereof.

Moreover, as the reactive silicone (2), compounds having a skeleton represented by the following general formula can be presented.

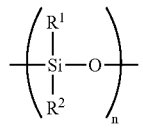

n is an integer of 2 or more, $R^1$, $R^2$ each are a substituted or non substituted alkyl, alkenyl, aryl or cyanoalkyl group having 1 to 10 carbon atoms, and 40% or less of the entirety based on the mole ratio is a vinyl, a phenyl, or a halogenated phenyl. Moreover, those having $R^1$, $R^2$ as a methyl group are preferable since the surface energy becomes the smallest, and it is preferable that a methyl group accounts for 60% or more based on the mole ratio. Moreover, at least one reactive group such as a hydroxyl group is provided in a molecular chain at the chain end or the side chain.

Moreover, together with the above-mentioned organopolysiloxane, a stable organosilicon compound with no cross-linking reaction such as a dimethylpolysiloxane may be mixed to a binder.

In the present embodiment, a surfactant which can be decomposed by action of the photocatalyst and has a function of varying the wettability by the decomposition can be included in the photocatalyst containing layer. Specifically, hydrocarbons of the respective series of NIKKO L BL, BC, BO, and BB manufactured by Nikko Chemicals Co., Ltd., and fluorine base or silicone base nonionic surfactants such as ZONYL FSN and FSO manufacture by Du Pont Kabushiki Kaisha, Surflon S-141 and 145 manufactured by ASAHI GLASS CO., LTD., Megaface F-141 and 144 manufactured by DAINIPPON INK AND CHEMICALS, Inc., FTERGENT F-200 and F251 manufactured by NEOS, UNIDYNE DS-401 and 402 manufactured by DAIKIN INDUSTRIES, Ltd., and Fluorad FC-170 and 176 manufactured by 3M can be cited, and cationic surfactants, anionic surfactants and amphoteric surfactants also can be used.

Other than the surfactants, oligomers and polymers such as polyvinyl alcohol, unsaturated polyester, acrylic resin, polyethylene, diallyl phthalate, ethylene propylene diene monomer, epoxy resin, phenol resin, polyurethane, melamine resin, polycarbonate, polyvinyl chloride, polyamide, polyimide, styrene-butadiene rubber, chloroprene rubber, polypropylene, polybutylene, polystyrene, polyvinyl acetate, nylon, polyester, polybutadiene, polybenzimidazole, polyacrylonitrile, epichlorohydrine, polysulfide, polyisoprene and the like can be cited.

(2) Second Embodiment

The wettability changeable layer of this embodiment includes a photocatalyst processing layer containing at least a photocatalyst, and a wettability variable layer formed on the photocatalyst processing layer to have the wettability change by the action of the photocatalyst accompanied by the energy irradiation. Since the wettability changeable layer including the photocatalyst processing layer and the wettability variable layer have the layers separately for each function, it is advantageous in that the layer configuration, the material combination, or the like can be changed easily.

Hereinafter, the photocatalyst processing layer and the wettability variable layer will be explained.

(i) Photocatalyst Processing Layer

The photocatalyst processing layer used in this embodiment is not particularly limited as long as it is a layer containing at least a photocatalyst to be excited by the energy irradiation. Such photocatalyst processing layer can be the same as the photocatalyst containing layer explained in the above-mentioned first embodiment.

Moreover, since the wettability of the surface of the photocatalyst processing layer needs not be changed in this embodiment, the wettability change of the binder itself by the action of the photocatalyst may not be generated, and thus the material for changing the wettability needs not be contained in the photocatalyst processing layer as in the first embodiment. In the case the photocatalyst processing layer contains the photocatalyst and the binder, the photocatalyst processing layer can be formed easily. On the other hand, in the case the photocatalyst processing layer consists of a photocatalyst only, compared with the case of using a binder, the wettability of the wettability variable layer surface can be changed efficiently.

(ii) Wettability Variable Layer

The wettability variable layer used in this embodiment is not particularly limited as long as the wettability is changed by the action of the photocatalyst in the above-mentioned photocatalyst processing layer excited by the energy irradiation. It is preferably formed by the same material as the binder in the photocatalyst containing layer of the above-mentioned first embodiment. In this embodiment, since the wettability variable layer of the above-mentioned components is used, by the action of the photocatalyst in the adjacent photocatalyst processing layer, by the action of oxidation, decomposition, or the like of an organic group or an additive agent as a part of the above-mentioned components, the wettability of the energy irradiated portion can be changed so as to be lyophilic for generating a large wettability difference with respect to the energy unirradiated portion.

Moreover, the wettability variable layer may contain fluorine in the same manner as in the above-mentioned first embodiment. Furthermore, in this embodiment, the photocatalyst needs not be contained in the wettability variable layer. In this case, the possibility of the photocatalyst influence on the functional part with time can be reduced. The material and so on of the wettability variable layer used in the present embodiment is the same as that of the photocatalyst containing layer of the first embodiment, thus the explanation is omitted here.

As for the wettability variable layer used in the present embodiment also, in the region not irradiated with energy, that is, in the liquid repellent region, it is preferable to have the contact angle with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more for the following reason: the region not irradiated with the energy is a region for which liquid repellency is required; therefore, in the case that the contact angle with the above-mentioned liquid is small, the liquid repellency is insufficient; and, for example, when an organic EL layer forming coating solution for forming an organic EL layer of organic EL element is applied by an ink-jetting method or the like and hardened, the organic EL layer forming coating solution may also adhere onto the liquid repellent region; it therefore becomes difficult to form a functional part such as an organic EL layer, highly precisely.

About the wettability variable layer, in the region irradiated with energy, that is, in the lyophilic region, preferably, the contact angle with a liquid having a surface tension of 40 mN/m is less than 9°, more preferably, the contact angle with a liquid having a surface tension of 50 mN/m is 10° or less, and even more preferably the contact angle with a liquid having a surface tension of 60 mN/m is 10° or less for the following reason: in the case that the contact angle with the liquid is high in the region irradiated with the energy, that is, in the lyophilic region, the lyophilic region also repels, for example, an organic EL layer forming coating solution for forming an organic EL layer of an organic EL element; and, for example, when the organic EL layer forming coating solution is applied by an ink-jetting method, this solution is not sufficiently applied or spread; it therefore becomes difficult to form a functional part, such an organic EL layer.

The contact angle to the liquid is measured by the method mentioned above.

In the present embodiment, the thickness of the wettability variable layer is preferably in a range of 0.001 μm to 1 μm, and particularly preferably in a range of 0.01 μm to 0.1 μm. Accordingly, the layer can be a layer wherein the wettability changes efficiently by an action of the photocatalyst contained in the photocatalyst processing layer.

(3) Third Embodiment

The wettability changeable layer of this embodiment is a wettability variable layer with the wettability changeable layer and a photocatalyst processing layer on the photocatalyst processing layer side substrate having at least a photocatalyst processing layer containing a photocatalyst and a base body disposed with a predetermined gap so as to have the wettability change by the energy irradiation from a predetermined direction. Since the wettability variable layer does not contain a photocatalyst, it is advantageous in that the functional element is not influenced by the photocatalyst with time passage when a functional element is provided by using a pattern formed body of the present invention.

The wettability variable layer of this embodiment is not particularly limited as long as it is a layer to have the contact angle with respect to a liquid lowered by the action of the photocatalyst excited by the energy to be directed. For example, the wettability variable layer of this embodiment may contain a fluorine so as to have the fluorine content in the wettability variable layer surface lowered at the time of directing the energy to the wettability variable layer by the action of the photocatalyst compared with the state before the energy irradiation, moreover, it may be one containing a decomposable substance to be decomposed by the action of the photocatalyst by the energy irradiation and thereby the wettability of the surface of the wettability variable layer can be changed.

For other aspects of the wettability variable layer, since they are the same as those mentioned in the column of the wettability variable layer for the second embodiment, the explanation is omitted here. Furthermore, as for the photocatalyst processing layer side substrate and the method of producing a patterning substrate, they will be described in the column of "E. Method of producing a pattern formed body" to be detailed later. Thus the explanation is omitted here.

C. Functional Element

Next, the functional element of the present invention will be explained. The functional element of the present invention includes the above-mentioned patterning substrate, and a functional part formed in the functional part formation region on the wettability changeable layer of the above-mentioned patterning substrate.

According to the present invention, by using the above-mentioned patterning substrate, the wettability changeable pattern with the wettability changed can be formed so that the functional part can be formed easily utilizing the wettability difference of the wettability changeable pattern. Moreover, since the above-mentioned patterning substrate is used, the contact angle with respect to a liquid in the lyophilic region of the wettability changeable pattern can be optimized before formation of the functional part so that a functional element with a good yield can be provided.

The word "functional" means one or more out of various functions such as optical functions (such as light selective absorption, reflectivity, polarizability, light selective transparency, nonlinear optical property, luminescence such as fluorescence or phosphorescence, and photochromism); magnetic functions (such as hard magnetism, soft magnetism, non-magnetism, magnetic permeability); electric or electronic functions (such as electroconductivity, electric insulation, piezoelectricity, pyroelectricity and dielectricity); chemical functions (such as adsorption, desorption, catalytic property, water absorptivity, ion conductivity, redox property, electrochemical property, and electrochromism); mechanical functions (such as abrasion resistance); thermal functions (such as heat transfer property, adiathermancy, and infrared ray radiating property), and biological functions (such as living body adaptability, and antithrombotic property).

As the functional element used in the present invention, among the above-mentioned functional elements, an organic EL element, a color filter, a conductive pattern, or the like are preferable. Moreover, as the functional part, an organic EL layer of an organic EL element, a colored layer of a color filter, a metal wiring of a conductive pattern, or the like are preferable. The functional part of the functional elements can be formed easily, utilizing the wettability difference of the above-mentioned wettability changeable pattern.

For example, when the functional elements of the present invention is the color filter, by using a wettability difference of the wettability changeable layer surface, a colored layer can easily be formed by ink-jetting or the like. Thus, a color filter having a highly precise colored layer can be manufactured.

The colored layer is usually formed in three colors of red (R), green (G) and blue (B). The form of the colored pattern in the colored layer can be rendered a known form, such as a stripe form, a mosaic form, a triangular form, a four-pixel arrangement form. The colored area of the colored layer can be set at will.

The colored layer may be the same as the colored layer used in an ordinary color filter. Thus, detailed description thereof is omitted herein.

For instance, when the functional elements of the present invention is the conductive pattern, an conductive pattern in which highly precise metallic wiring is formed can be manufactured by applying a metallic paste or the like by, for example, an electric field jetting method using a wettability difference of the wettability changeable pattern.

In this case, since the metallic wiring is formed on the wettability changeable layer, the electric resistance of the wettability changeable layer is set preferably into a range of $1\times10^8$ Ω·cm to $1\times10^{18}$ Ω·cm, more preferably into a range of $1\times10^{12}$ Ω·cm to $1\times10^{18}$ Ω·cm. This makes it possible to form an excellent conductive pattern.

The material for each of the members used for the conductive pattern, the method for forming each of the members, and so on may be the same as ordinary conductive patterns. Thus, description is omitted herein.

D. Organic EL Element

Next, the organic EL element of the present invention will be explained. In the organic EL element of the present invention, the functional part of the above-mentioned functional element as an organic EL layer includes at least a light emitting layer.

According to the present invention, the organic layer can easily be painted differently, or the like utilizing the wettability difference of the above-mentioned wettability changeable pattern so that a highly precise organic EL layer can be formed. Moreover, according to the present invention, since the contact angle with respect to a liquid in the lyophilic region of the wettability changeable pattern can be optimized before formation of the organic EL layer so that abandonment after formation of the organic EL layer can be avoided, and thus it is advantageous in terms of the cost.

Moreover, unless the contact angle with respect to a liquid in the lyophilic region of the wettability changeable pattern is sufficiently lowered, an organic EL layer having a thin thickness, in particular, the light emitting layer forming coating solution for forming a light emitting layer is repelled so as to have the considerably thin light emitting layer film thickness or fail to form the light emitting layer film. Moreover, in the case film thickness of the light emitting layer is too thin or the light emitting layer film is not formed, short circuit is generated between the facing electrodes, and thus it is problematic. On the other hand, according to the present invention, as mentioned above, since the contact angle with respect to a liquid in the lyophilic region of the wettability changeable pattern can be optimized before coating the light emitting layer forming coating solution, the problem can be avoided.

The organic EL element of the present invention in general includes a wettability changeable layer formed on the base material having a first electrode layer as the wettability inhibition part and the wettability inhibition examining part, an organic EL layer formed by utilizing the wettability changeable pattern of the wettability changeable layer and a second electrode layer formed on the organic EL layer.

At the time, for example as shown in FIG. 6, it is preferable that the insulation layer 42 is formed so as to cover the end portion of the first electrode layer 41. Moreover, in the case the first electrode layer 41 and the insulation layer 42 are formed in the lyophilic region 13 in FIG. 6, the contact angle with respect to a liquid may be different in the energy irradiated portion of the wettability changeable layer 5 on the first electrode layer 41 and in the energy irradiated portion of the wettability changeable layer 5 on the insulation layer 42. It is considered that the influence to the wettability change of the wettability changeable layer differs because the constituent materials, or the like are different for the first electrode layer and the insulation layer. Therefore, even in the case the contact angle with respect to a liquid is sufficiently lowered in the energy irradiated portion of the wettability changeable layer 5 on the first electrode layer 41 for example, if the contact angle with respect to a liquid in the energy irradiated portion of the wettability changeable layer 5 on the insulation layer 42 is insufficient, the film thickness of the light emitting layer formed on the wettability changeable layer 5 on the insulation layer 42 can be thinner than the targeted film thickness or the light emitting layer film may not be formed. Moreover, in the case the film thickness of the light emitting layer is too thin or the light emitting layer film is not formed, it may cause the short circuit between the electrodes. Therefore, it is important to examine whether or not the contact angle with respect to a liquid is appropriate both in the energy irradiated portion of the wettability changeable layer 5 on the first electrode layer 41 and in the energy irradiated portion of the wettability changeable layer 5 on the insulation layer 42.

Moreover, in such a case, for example as shown in FIG. 6, it is possible that the insulation layer 42 is formed so as to cover the end portion of the first electrode layer 41 on the base material 1 in the contact angle measuring region 2 and the wettability changeable layer is formed thereon, or it is also possible that only the first electrode layer is formed on the base material in the contact angle measuring region or only the insulation layer is formed on the base material in the contact angle measuring region and the wettability changeable layer is formed thereon. As mentioned above, it is for measuring whether or not the contact angle with respect to a liquid is appropriate can be measured in the energy irradiated portion of the wettability changeable layer on the first electrode layer and the energy irradiated portion of the wettability changeable layer on the insulation layer.

Moreover, since the wettability changeable layer in the organic EL element of the present invention is formed in general between the first electrode layer and the second electrode layer facing with each other, it is preferable to have a function of transporting the positive hole or the electron.

In the present invention, as mentioned above, in the case the wettability changeable layer is a photocatalyst containing layer (first embodiment), the content of the photocatalyst in the photocatalyst containing layer is preferably an amount to the extent not to disturb the transportation of the positive hole or the electron among the amount descirbed in the above-mentioned section of "B. Patterning substrate 1. Wettability changeable layer (1) First embodiment." Depending on the photocatalyst content, an adverse effect may be posed to the electric characteristics of the organic EL element.

In this case, among the thickness mentioned above, the thickness of the photocatalyst containing layer is preferably in a range of 0.01 µm to 1 µm, more preferably in a range of 0.01 µm to 0.5 µm, and particularly preferably in a range of 0.01 µm to 0.2 µm.

If the photocatalyst containing layer is too thin, the wettability difference cannot be provided clearly so that the wettability changeable pattern formation becomes difficult. On the other hand, if the photocatalyst containing layer is too thick, the transportation of the positive hole or the electron is disturbed so that the adverse effect may be posed to the electric characteristics of the organic EL element.

In case of the wettability changeable layer comprises the photocatalyst processing layer and the wettability variable layer as mentioned above (second embodiment), the thickness of the photocatalyst processing layer is preferably in a range of 0.01 µm to 1 µm, more preferably in a range of 0.01 µm to 0.5 µm, and particularly preferably in a range of 0.01 µm to 0.2 µm. If the photocatalyst processing layer is too thin, it may be difficult to change the wettability of the wettability variable layer. On the other hand, if the photocatalyst processing layer is too thick, the transportation of the positive hole or the electron is disturbed so that the adverse effect may be posed to the electric characteristics of the organic EL element.

In this case, the wettability variable layer may contain a charge transporting property improving substance for the purpose of improving the charge transporting property for transporting the electron or the positive hole.

Among the thickness described in the column of "B. Patterning substrate 1. Wettability changeable layer (2) Second embodiment", a thickness of the wettability variable layer is a thickness of not disturbing the transportation of the electron or the positive hole.

Moreover, in case the wettability changeable layer is the wettability variable layer as mentioned above (third embodiment), the wettability variable layer may contain a charge transporting property improving substance for the purpose of improving the charge transporting property for transporting the electron or the positive hole.

In this case, the thickness of the wettability variable layer is preferably a thickness of not disturbing the transportation of the electron or the positive hole.

The material for each of the members used for the organic EL element, the method for forming each of the members, and so on may be the same as the ordinary organic EL element. Thus, description is omitted herein.

E. Method of Producing a Pattern Formed Body

Next, the method of producing a pattern formed body of the present invention will be explained. The method of producing a pattern formed body of the present invention can be classified into two embodiments according to the wettability changeable layer configuration and the energy irradiating step. Specifically, in the case the wettability changeable layers of the first embodiment and the second embodiment described in the above-mentioned section of "B. Patterning substrate 1. Wettability changeable layer" are formed, it is preferable to adopt the fourth embodiment or the fifth embodiment of the method of producing a pattern formed body of the present invention. On the other hand, in the case the wettability changeable layer of the third embodiment is formed it is preferable to adopt the fifth embodiment of the method of producing a pattern formed body of the present invention.

Hereinafter each embodiment will be explained.

1. Fourth Embodiment

The method of producing a pattern formed body of the present embodiment comprising: a wettability inhibition part forming step of forming a wettability inhibition part in a functional part formation region to be provided with a functional part on a base material, and a wettability inhibition examining part in a functional part non formation region without a functional part on the base material, a wettability changeable layer forming step of forming a wettability changeable layer to have the wettability change by the action of the photocatalyst accompanied by the energy irradiation on the base material with the wettability inhibition part and the wettability inhibition examining part formed, an energy directing step of forming a wettability changeable pattern with the wettability of the wettability changeable layer changed by directing an energy in a pattern to the wettability changeable layer so as to change the wettability in the wettability changeable layer in the contact angle measuring region for measuring the contact angle with respect to a liquid in the functional part formation region and a part of the functional part non formation region, and an examining step of measuring the contact angle with respect to a liquid of the wettability changeable layer surface of the contact angle measuring region.

Figure 7E:
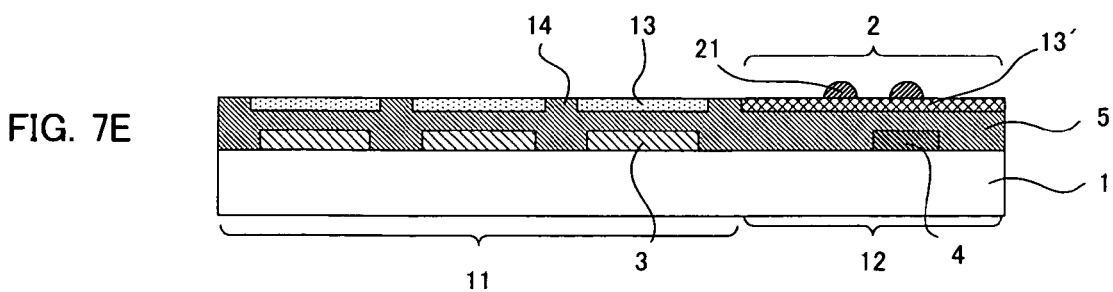

For example as shown in FIGS. 7A to 7E, the method of producing a pattern formed body of this embodiment includes a wettability inhibition part forming step of forming a wettability inhibition part 3 on a functional part formation region 11 on a base material 1 and forming a wettability inhibition examining part 4 on a functional part non formation region 12 on the above-mentioned base material 1 (FIG. 7A), a wettability changeable layer forming step of forming a wettability changeable layer 5 formed on the base material 1 with the wettability inhibition part 3 and the wettability inhibition examining part 4 formed (FIG. 7B), an energy directing step of directing the energy 32 in a pattern via a photo mask 31 to the wettability changeable layer 5 so as to have the wettability change of the wettability changeable layer 5 of the contact angle measuring region 2 as a part of the functional part formation region 11 and the functional part non formation region 12 (FIG. 7C) for forming a wettability changeable pattern including the lyophilic regions 13, 13' and the liquid repellent region 14 (FIG. 7D), and an examining step of measuring the contact angle with respect to a liquid by adhering a suspension 21 to the lyophilic region 13' on the surface of the wettability changeable layer 5 of the contact angle measuring region 2 (FIG. 7E).

According to the present embodiment, since an examining step of measuring the contact angle with respect to the liquid in the lyophilic region of the wettability changeable layer is provided, the exposing amount in the energy irradiating step can be optimized before formation of the functional part on the wettability changeable layer, and furthermore, the exposure irregularity, the film thickness irregularity of the wettability changeable layer, or the like can be examined. Therefore, a production method excellent in step administration can be provided.

Moreover, in the case of abandoning a pattern formed body with the defect such as lacking is detected in the functional part after the formation of a functional part, although it depends on the cost of the substrate, the functional part, or the like to be used, in general the cost is increased. According to this embodiment, in the case the contact angle with respect to a liquid in the lyophilic region is insufficient, or the like, the contact angle with respect to a liquid can be lowered in the lyophilic region by re-carrying out the energy directing step. Thereby, the cost and the abandoned products can be reduced.

Furthermore, according to this embodiment, by directing the energy in the energy directing step, the wettability of the wettability changeable layer can be changed by exciting the photocatalyst in the wettability changeable layer so that the wettability changeable pattern can easily be formed. Therefore, a pattern formed body capable of forming various functional parts such as the organic EL layer of the organic EL element and the colored layer of the color filter by utilizing the wettability difference of the wettability changeable pattern can easily be produced.

Hereinafter, each step of the method of producing a pattern formed body of this embodiment will be explained in detail.

(1) Wettability Inhibition Part Forming Step

The wettability inhibition part forming step in this embodiment is a step of forming a wettability inhibition part on a functional part formation region on a base material and forming a wettability inhibition examining part in a functional part non formation region on the above-mentioned base material.

The wettability inhibition part and the wettability inhibition examining part in this embodiment can be selected and formed optionally according to the kind, the application, or the like of the pattern formed body as described in the above-mentioned section of "A. Substrate for pattern formation." Since the other points of the wettability inhibition part and the wettability inhibition examining part and the contact angle measuring region are described in the above-mentioned "A. Substrate for pattern formation", explanation is not described here.

(2) Wettability Changeable Layer Forming Step

The wettability changeable layer forming step in this embodiment is a step of forming a wettability changeable layer to have the wettability change by the action of the photocatalyst accompanied by the energy irradiation on the base material with the above-mentioned wettability inhibition part and the wettability inhibition examining part formed. The wettability changeable layer can be formed by applying a wettability changeable layer forming coating solution.

For example, in the case of the wettability changeable layer is the photocatalyst containing layer (first embodiment), the photocatalyst containing layer can be formed by dispersing a photocatalyst, the organopolysiloxane or the like as the binder, and optional other additives into a solvent to prepare a photocatalyst containing layer forming coating solution and then applying this solution onto a base material. As the solvent to be used, alcohol based organic solvents such as an ethanol and an isopropanol are preferable. The coating operation can be carried out by a known coating method such as spin coating, spray coating, dip coating, roll coating and bead coating. In the case an ultraviolet ray curable type component is contained as a binder, the photocatalyst containing layer can be formed with an execution of a cure process by irradiating an ultraviolet ray.

On the other hand, in case the wettability changeable layer contains the photocatalyst processing layer and the wettability variable layer (second embodiment), to form the photocatalyst processing layer containing no binder, a method using a vacuum film-forming method such as sputtering, CVD or vacuum vapor deposition can be used. According to the formation by the vacuum film-forming method, it is possible to form, as an even film, the photocatalyst processing layer which contains only the photocatalyst. In this way, the wettability on the wettability variable layer surface can be evenly varied.

Another example of the method for forming the photocatalyst processing layer made only of a photocatalyst, is the following method: in the case that the photocatalyst is, for example, titanium dioxide, amorphous titania is formed on the base material on which the wettability inhibition part and the wettability inhibition examining part, subseqently fired so as to phase-change the titania to crystalline titania. The amorphous titania used in this case can be obtained, for example, by hydrolysis or dehydration condensation of an inorganic salt of titanium, such as titanium tetrachloride or titanium sulfate, or hydrolysis or dehydration condensation of an organic titanium compound, such as tetraethoxytitanium, tetraisopropoxytitanium, tetra-n-propoxytitanium, tetrabutoxytitanium or tetramethoxytitanium, in the presence of an acid. Next, the resultant is fired at 400° C. to 500° C. so as to be denatured to anatase type titania, and fired at 600° C. to 700° C. so as to be denatured to rutile type titania.

The method of forming the photocatalyst processing layer containing the photocatlyst and the binder is the same method of forming the photocatalyst containing layer mentioned above.

Moreover, the wettability variable layer can be formed by preparing a wettability variable layer forming coating solution by dispersing a binder as needed with other additives in a solvent, and applying the wettability variable layer forming coating solution. The other points of the method of forming the wettability variable layer are the same as the above-mentioned method of forming the photocatalyst containing layer.

(3) Energy Directing Step

The energy directing step in this embodiment is a step of directing the energy in a pattern to the above-mentioned wettability changeable layer for changing the wettability of the wettability changeable layer in the functional part formation region and the contact angle measuring region for forming a wettability changeable pattern with the wettability of the above-mentioned wettability changeable layer changed.

The energy irradiation (exposure) in the present invention is the concept including the irradiation of any energy line capable of exciting the photocatalyst. In addition to the ultraviolet ray, the visible light beam and the infrared ray, the electromagnetic waves and the radiations of a wavelength shorter or longer than the same are included as well.

The energy irradiation method is not particularly limited as long as it is a method capable of changing the wettability of the wettability changeable layer. Moreover, the energy irradiation may be carried out using a mask such as a photo mask, with a purposed pattern formed. Thereby, the energy irradiation in a purposed pattern can be enabled so that the wettability of the wettability changeable layer can be changed in a pattern. At the time, the kind of the mask to be used is not particularly limited as long as the energy irradiation in a purposed pattern can be enabled. It may be a photo mask or the like with a light shielding part formed in a energy transmittable material, or it may be a shadow mask or the like with a hole part formed in a purposed pattern. As a material for the mask, specifically, an inorganic substance such as a metal, a glass or a ceramic, or an organic substance such as a plastic or the like, can be cited.

Furthermore, in the case a light shielding part is formed on the substrate to be used, the energy irradiation may be the entire surface exposure from the substrate side, utilizing the light shielding part. Thereby, the energy can be directed only to the wettability changeable layer at a position without formation of the light shielding part so as to change the wettability of the wettability changeable layer. In this case, since it is unnecessary to use the mask or to irradiate a laser ray for drawing irradiation, the positioning or expensive device for drawing irradiation are not required. Thus it is advantageous.

For energy irradiation, ultraviolet ray is normally used. Specifically, a wavelength of the ultraviolet ray is set in a range of 400 nm or less, preferably in a range of 150 nm to 380 nm. This is because, as mentioned above, a preferable photocatalyst used in the wettability changeable layer is the titanium dioxide and it is preferable to use the light of the above wavelength as energy to activate the photocatalyst action with the titanium dioxide.

As for the light source that can be used for such an energy irradiation, various light sources such as a mercury lamp, a metal halide lamp, a xenon lamp, and an excimer lamp can be cited. The energy can be irradiated using a laser such as an excimer or YAG. By using the laser to irradiate the energy, the positioning of the photomask mentioned above or the like becomes unnecessary, thus the wettability of the wettability changeable layer can be changed highly precisely without forming the light shielding part on the substrate.

Moreover, in the case an anatase type titanium dioxide is used as the photocatalyst, since the excitation wavelength of the anatase type titanium dioxide is 380 nm or less, the energy irradiation can be carried out with an ultraviolet ray. For the light source which radiates such ultraviolet ray, a high pressure mercury lamp (154, 313, 365, 405, 436, 546, 577 nm), a superhigh pressure mercury lamp (250 to 600 nm), a metal halide lamp (250 to 600 nm), a xenon lamp (300 to 1100 nm), an excimer laser, or other ultraviolet ray light sources can be used.

The energy irradiation amount at the time of the energy irradiation is an irradiation amount necessary for changing the wettability of the wettability changeable layer by the action of the photocatalyst in the wettability changeable layer.

In this case, it is preferred to irradiate energy onto the wettability changeable layer while heating the layer since the sensitivity can be made high so that the wettability can be effectively changed. Specifically, it is preferred to heat in a range of 30° C. to 80° C.

(4) Examining Step

The examining step in this embodiment is a step of measuring the contact angle with respect to a liquid of the surface of the wettability changeable layer in the above-mentioned contact angle measuring region. Specifically, by adhering a suspension to the lyophilic region of the wettability changeable layer in the contact angle measuring region, the contact angle with respect to a liquid is measured.

The above-mentioned suspension is not particularly limited as long as it can adhere only to the lyophilic region of the wettability pattern on the pattern formed body, and a non pollutant suspension having the surface tension of a predetermined value or higher can be used preferably. That is, in this embodiment, the suspension is adhered only to the lyophilic region and thereby the contact angle with respect to a liquid is measured. Here, if a suspension having a surface tension smaller than the critical surface tension of the liquid repellent region is used, the contact angle with respect to the suspension becomes 0° both in the lyophilic region and the liquid repellent region so that it is impossible to adhere the suspension only to the lyophilic region. Moreover, if a suspension of a surface tension smaller than the critical surface tension of the lyophilic region is used, difference between the contact angle of the suspension with respect to the lyophilic region and the contact angle of the suspension with respect to the liquid repellent region may not be sufficient. Therefore, in this embodiment, a suspension having a surface tension of a predetermined surface tension or more is used preferably.

Specifically, it is preferable to use a suspension having a surface tension of 20 mN/m or more, particularly 30 mN/m or more, and further particularly 50 mN/m or more. Moreover, although the upper limit of the surface tension of the suspension is not particularly limited, it is preferably 75 mN/m or less.

Moreover, it is preferable that the suspension used in this embodiment is non pollutant. At the time of the examination, it is preferable to use the pattern formed body provided for the examination is used as the product as it is, however, in the case a suspension, which may pollute the pattern formed body is used, it is difficult to completely eliminate the suspension so that it may not be used as the product as it is. Moreover, after the examination using such a pollutant suspension, for completely eliminating the suspension, any process needs to be carried out at the time of the elimination. By applying such a process, the wettability pattern on the pattern formed body may be destroyed.

As such a non pollutant suspension, water, a mixed solution of water and alcohol, a mixed solution of a solvent compatible to water, such as a glycerin and an N-mthyl-2-pyrrolidone and water, or the like can be presented. A solvent other than those containing water may also be used as long as it has the above-mentioned surface tension and capable of forming a pattern.

Moreover, a solution with a coloring agent such as a dye dissolved and the above-mentioned solution used as the solvent maybe used for the purpose of improving the visibility. However, in the case a coloring material such as a dye is mixed, it is necessary to have the concentration in consideration to the non polluting property of the pattern formed body.

As the coloring dye, an azo based dye, an anthraquinone based dye, an indicoid based dye, a phthalocyanine based dye, a carbonium based dye, a quinoneimine based dye, a methine based dye, a quinoline based dye, a nitro based dye, a benzoquinone based dye, a naphthoquinone based dye, a naphthalimide based dye, a perinone based dye, a pyrylium based dye, a thiapyrylium based dye, an azulenium based dye, a squarylium salt based dye, or the like can be presented, but it is not limited thereto. One capable of satisfying the non polluting property of the pattern formed body can be used.

In this embodiment, in particular it is most preferable to use water because water has a high surface tension and the non polluting property, and furthermore, it is inexpensive and advantageous in terms of the cost. In this embodiment, as needed, various additives may be added to water used as the suspension.

As to the method of adhering such a suspension, for example, a nozzle ejection method can be used. As the nozzle ejecting method, for example, a micro syringe, a dispenser, an ink jet, a method of ejecting the suspension from the needle tip by the external stimulus such as the electric field, a method of ejecting the suspension from an element using a vibration element such as a piezoelectric element to be vibrated by the external stimulus, a method of adhering the suspension adhered on the needle tip to the surface of the wettability changeable layer, or the like can be presented.

The contact angle with respect to a liquid in this step is obtained from the results or a graph of the results of measuring (30 seconds after of dropping liquid droplets from a micro syringe) the contact angle with respect to the above-mentioned suspension using a contact angle measuring device (CA-Z type manufactured by Kyowa Interface Science, Co., Ltd).

Moreover, in this embodiment, after measuring the contact angle with respect to a liquid, an eliminating process of eliminating the adhered suspension is carried out. The method of eliminating the suspension, or the like is not particularly limited as long as it is a method capable of eliminating the adhered suspension without damaging the wettability pattern on the pattern formed body. Specifically, if the suspension can easily be evaporated, a heating method, a method of eliminating by the high speed rotation in a state being mounted on a spin device to be used for the spin coating method, a method of blowing off by the high pressure air, or the like can be presented. Moreover, in the case the suspension is colored, or the like, for example a method of washing with a washing liquid having the compatibility such as the same substance, or the like can be presented.

(5) Others

According to the method of producing a pattern formed body of this embodiment, in addition to the above-mentioned wettability inhibition part forming step, wettability changeable layer forming step, energy directing step and examining step, as needed, another step may be provided optionally.

2. Fifth Embodiment

The method of producing a pattern formed body of this embodiment includes a wettability inhibition part forming step of forming a wettability inhibition part in a functional part formation region to be provided with a functional part on a base material, and a wettability inhibition examining part in a functional part non formation region without a functional part on the above-mentioned base material, a wettability changeable layer forming step of forming a wettability changeable layer to have the wettability change by the action of the photocatalyst accompanied by the energy irradiation on the above-mentioned base material with the above-mentioned wettability inhibition part and the above-mentioned wettability inhibition examining part formed, an energy directing step of forming a wettability changeable pattern with the wettability of the above-mentioned wettability changeable layer changed by directing an energy in a pattern so as to change the wettability of the functional part formation region provided with the functional part and of the above-mentioned wettability changeable layer in the contact angle measuring region for measuring the contact angle with respect to a liquid as a part of the above-mentioned functional part non formation region, after disposing the above-mentioned photocatalyst processing layer of the photocatalyst processing layer side substrate having a photocatalyst processing layer containing a photocatalyst and a base body, and the above-mentioned wettability changeable layer with a predetermined gap, and an examining step of measuring the contact angle with respect to a liquid of the wettability changeable layer surface of the above-mentioned contact angle measuring region.

Figure 8A:
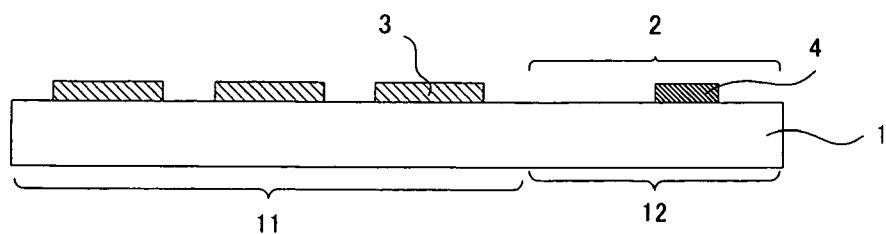
FIG. 8A to 8E is a process diagram showing another example of a method of producing a pattern formed body of the present invention.
Figure 8B:
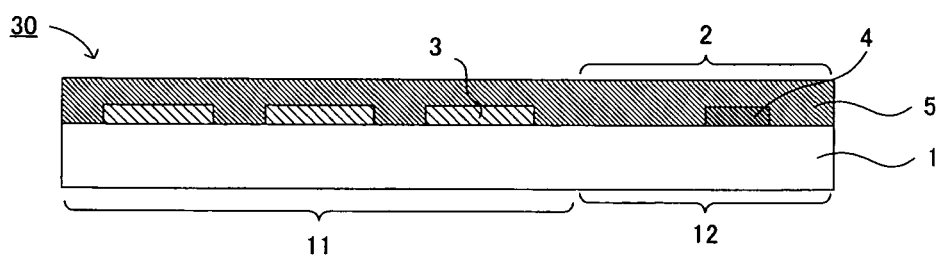
Figure 8C:
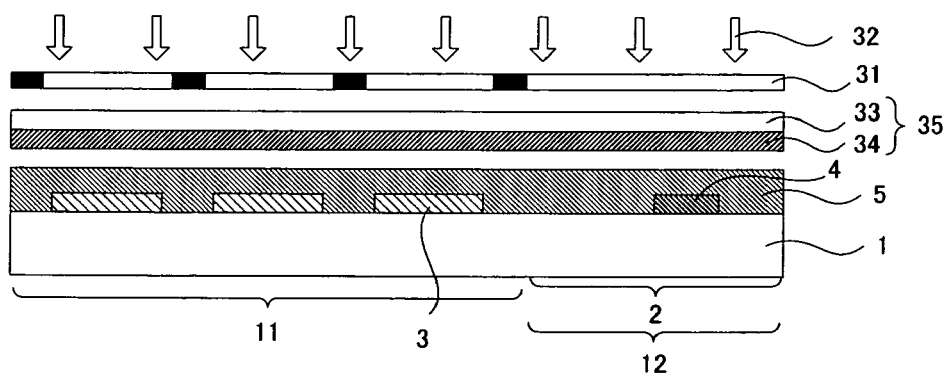
Figure 8D:
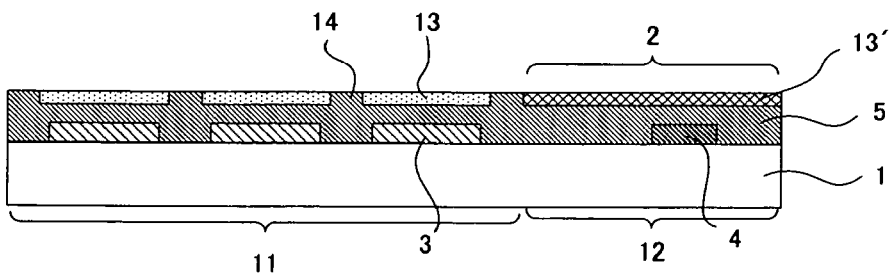
Figure 8E:
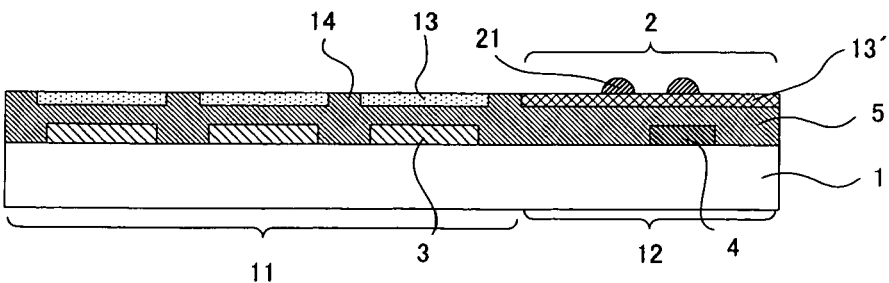

For example as shown in FIGS. 8A to 8E, the method of producing the pattern formed body of this embodiment includes a wettability inhibition part forming step of forming a wettability inhibition part 3 on a functional part formation region 11 on a base material 1 and forming a wettability inhibition examining part 4 on a functional part non formation region 12 on the base material 1 (FIG. 8A), a wettability changeable layer forming step of forming a wettability changeable layer 5 on the base material 1 with the wettability inhibition part 3 and the wettability inhibition examining part 4 formed (FIG. 8B), an energy directing step of directing the energy 32 via a photo mask 31 to the wettability changeable layer 5 so as to have the wettability change of the wettability changeable layer 5 of the contact angle measuring region 2 as a part of the functional part formation region 11 and the functional part non formation region 12 (FIG. 8C) after preparing a photocatalyst processing layer side substrate 35 having a photocatalyst processing layer 34 and a base body 33 and disposing the photocatalyst processing layer 34 of the photocatalyst processing layer side substrate 35 and the wettability changeable layer 5 of the patterning substrate 30 so as to have a predetermined gap for forming a wettability changeable pattern including the lyophilic regions 13, 13' and the liquid repellent region 14 (FIG. 8D), and an examining step of measuring the contact angle with respect to a liquid by adhering a suspension 21 to the lyophilic region 13' on the surface of the wettability changeable layer 5 of the contact angle measuring region 2 (FIG. 8E).

According to this embodiment, as in the above-mentioned fourth embodiment, since the examining step is provided, the exposure amount in the energy irradiating step can be optimized so that a production method with the excellent process administration can be provided. Moreover, the cost and the abandoned products can be reduced.

Furthermore, according to this embodiment, since the energy is directed with the wettability changeable layer and the photocatalyst processing layer of the photocatalyst processing layer side substrate faced with each other in the energy directing step, a wettability changeable pattern with the wettability of the wettability changeable layer changed can be formed by the action of the photocatalyst in the photocatalyst processing layer. Therefore, a pattern formed body capable of forming the various functional parts, such as an organic EL layer of an organic EL element and a colored layer of a color filter can be easily produced utilizing the wettability difference of the wettability changeable pattern.

Since the wettability inhibition part forming step and the examining step are the same as those mentioned in the section of the fourth embodiment, explanation is not described here. Hereinafter, the wettability changeable layer forming step and the energy directing step of the method of producing a pattern formed body of this embodiment will be explained in detail.

(1) Wettability Changeable Layer Forming Step

The wettability changeable layer forming step in this embodiment is a step of forming a wettability changeable layer to have the wettability change by the action of the photocatalyst accompanied by the energy irradiation on a base material with the above-mentioned wettability inhibition part and the wettability inhibition examining part formed. The wettability changeable layer can be formed by preparing a wettability variable layer forming coating solution by dispersing the components used in the third embodiment (wettability variable layer) of the wettability changeable layer mentioned in the section of "B. Patterning substrate" as needed with other additives, and coating the wettability variable layer forming coating solution.

Since the method of forming the wettability variable layer is the same as the forming method of the first embodiment (photocatalyst containing layer) of the wettability changeable layer mentioned in the section of the fourth embodiment, explanation is not described here.

(2) Energy Directing Step

The energy directing step in this embodiment is a step of forming a wettability changeable pattern with the wettability of the above-mentioned wettability changeable layer changed by directing an energy in a pattern so as to change the wettability of the functional part formation region and the wettability changeable layer in the contact angle measuring region after disposing the above-mentioned photocatalyst processing layer of the photocatalyst processing layer side substrate having a photocatalyst processing layer containing a photocatalyst and a base body, and the wettability changeable layer with a predetermined gap.

Hereinafter, the energy directing method, and the photocatalyst processing layer side substrate used in this step will be explained.

(i) The Method for Radiating the Energy

In the invention, the energy radiation is performed in the state that the photocatalyst processing layer of the photocatalyst processing layer side substrate to detailed later and the wettability changeable layer are arranged so as face to each other. The wording "are arranged" means that the above-mentioned two layers are arranged in the state that the action of the photocatalyst can substantially work to the surface of the wettability changeable layer, and include not only the state that the two layers physically contact each other, but also the state that the two layers are arranged at a given interval. The interval is preferably 200 μm or less.

The above-mentioned interval in the invention is more preferably from 0.2 μm to 10 μm, even more preferably from 1 μm to 5 μm since the precision of the pattern to be obtained becomes very good and further the sensitivity of the photocatalyst also becomes high so as to make good the efficiency of the wettability change of the wettability changeable layer. This range of the interval is particularly effective for the wettability changeable layer small in area, which makes it possible to control the interval with a high precision.

Meanwhile, in the case of radiating energy onto the wettability changeable layer large in area, for example, 300 mm or more×300 mm or more in size, it is very difficult to keep a fine interval as described above between the photocatalyst processing layer side substrate and the wettability variable layer without contacting each other. Accordingly, when the wettability changeable layer has a relatively large area, the interval is preferably in a range of 10 to 100 μm, more preferably in a range of 50 to 75 μm. The limitation of the interval into this range gives an advantageous effect of not causing problems based on a fall in patterning precision such as a problem that a blurred pattern is obtained, or other problems such as a problem that the sensitivity of the photocatalyst deteriorates so that the efficiency of the wettability change also deteriorates, and further gives an advantageous effect of not causing unevenness in the wettability change on the wettability changeable layer.

At the time of radiating energy onto the wettability changeable layer having a relatively large area as described from an energy radiating device, in a unit for positioning the photocatalyst processing layer side substrate and the wettability changeable layer precisely inside this device, the interval therebetween is set preferably into a range of 10 μm to 200 μm, more preferably into a range of 25 μm to 75 μm. The setting of the interval value into this range makes it possible to arrange the photocatalyst processing layer side substrate and the wettability changeable layer without causing a large drop in patterning precision or in sensitivity of the photocatalyst, and without bringing the photocatalyst processing layer side substrate and the wettability changeable layer into contact with each other.

When the photocatalyst processing layer and the surface of the wettability changeable layer are arranged at a given interval, active oxygen species generated from oxygen and water by action of the photocatalyst can easily be released. In other words, if the interval between the photocatalyst processing layer and the wettability changeable layer is made narrower than the above-mentioned range, the active oxygen species are not easily released, so as to make the rate for the wettability change unfavorably small. If the two layers are arranged at an interval larger than the above-mentioned range, it is difficult for the generated active oxygen species to reach the wettability changeable layer. In this case also, the rate for the wettability change unfavorably becomes small.

In the invention, it is sufficient that such an arrangement state is maintained at least only during the energy radiation.

The method for arranging the photocatalyst processing layer and the wettability changeable layer to keep such a very small interval evenly therebetween is, for example, a method of using spacers. The use of the spacers in this way makes it possible to keep an even interval. In regions which the spacers contact, the action of the photocatalyst does not work onto the surface of the wettability changeable layer; therefore, when the spacers are rendered spacers having a pattern similar to a given wettability changeable pattern to be formed, the wettability changeable pattern can be formed on the wettability changeable layer. The use of the spacers makes it possible that the active oxygen species generated by action of the photocatalyst reach the surface of the wettability changeable layer, without diffusing, at a high concentration. Accordingly, a highly precise wettability changeable pattern can be effectively formed.

In the case of using the photocatalyst processing layer side substrate in which the photocatalyst processing layer is formed on a flexible base body such as a flexible resin film, it is difficult to keep an interval as described above. Thus, it is preferred to arrange the photocatalyst processing layer and the wettability changeable layer to contact each other from the viewpoint of production efficiency and others.

In this case, it is preferred to radiate energy onto the photocatalyst processing layer while heating the layer since the sensitivity can be made high so that an effective wettability change can be formed. Specifically, it is preferred to heat in a range of 30° C. to 80° C.

The direction in which the energy is radiated is appropriately selected in accordance with whether or not the patterning substrate has light shielding part or whether or not the photocatalyst processing layer side substrate to be detailed later has photocatalyst processing layer side substrate light shielding part, or other factors.

In other words, when the photocatalyst processing layer side light shielding part is formed on the photocatalyst processing layer side substrate to be detailed later, it is necessary to radiate energy from the side of the photocatalyst processing layer side substrate. Furthermore, in this case, it is necessary that the photocatalyst processing layer side substrate is transparent for the radiated energy. When the photocatalyst processing layer side light shielding part is formed on the photocatalyst processing layer and further this light shielding part is used to fulfill a function of a spacer, as will be detailed later, the energy may be radiated from the side of the photocatalyst processing layer side substrate or from the side of the patterning substrate.

Meanwhile, when light shielding part is formed on the patterning substrate, energy can be radiated from the side of the patterning substrate. In this case, it is necessary that the patterning substrate is transparent for the radiated energy.

When the photocatalyst processing layer to be detailed later is formed into a pattern, energy may be radiated from any direction if the energy is radiated onto the portion where the photocatalyst processing layer and the wettability changeable layer are facing each other as mentioned above.

Furthermore, when a photomask is used, energy is radiated from the side where the photomask is arranged. In this case, it is necessary that the substrate on which the photomask is arranged, that is, the photocatalyst processing layer side substrate or the patterning substrate is transparent.

When the above-mentioned energy radiation is finished, the photocatalyst processing layer side substrate is separated from the position where the substrate contacts the wettability changeable layer. In this way, as shown in FIG. 8D, a wettability changeable pattern in which the wettability change of the wettability changeable layer 5 is varied is formed.

As for the energy, it is the same as the one explained in the forth embodiment, the explanation is omitted here.

(ii) Photocatalyst Processing Layer Side Substrate

The photocatalyst processing layer side substrate used in this step includes at least a photocatalyst processing layer containing a photocatalyst and the base body. In general, the base body and the photocatalyst processing layer are formed on the base body. The photocatalyst processing layer side substrate may include for example a photocatalyst processing layer side light shielding part formed in a pattern, or the like.

Hereinafter, each configuration of the photocatalyst processing layer side substrate will be explained.

(Photocatalyst Processing Layer)

No especial limitation is imposed on the photocatalyst processing layer if the layer has a structure capable of changing the wettability of the adjacent wettability changeable layer by action of the photocatalyst therein. The photocatalyst processing layer may be a layer made of the photocatalyst and a binder, or may be a film made only of the photocatalyst. The property of the surface thereof may be lyophilic or liquid repellent.

The photocatalyst processing layer may be a layer formed on the whole of a surface of the base body, or may be formed in a pattern on a base body.

When the photocatalyst processing layer is formed in a pattern form in this way, it is unnecessary to perform patterning radiation by use of a photomask or the like when energy is radiated in the state that the photocatalyst processing layer and the wettability changeable layer are arranged to keep a given interval. By radiating energy onto the entire surface, a pattern in which the wettability of the wettability changeable layer is changed can be formed. The method for patterning the photocatalyst processing layer is not particularly limited, and may be, for example, photolithography.

The wettability of only the wettability changeable layer portion which actually faces the photocatalyst processing layer is changed; therefore, the direction in which energy is radiated may be any direction if the energy can be radiated onto the portion where the photocatalyst processing layer and the wettability changeable layer face each other. Furthermore, there is produced an advantage that the radiated energy is not limited to energy composed of parallel components, such as parallel ray light.

As described above, the photocatalyst processing layer may be made only of the photocatalyst, or may be made of a mixture of the photocatalyst and a binder. The photocatalyst processing layer made only of the photocatalyst causes an improvement in efficiency of the wettability change of the wettability changeable layer, so as to shorten the treatment time and give other advantages from the viewpoint of costs. The photocatalyst processing layer made of the photocatalyst and a binder has an advantage that the photocatalyst processing layer is easily formed.

The method for forming the photocatalyst processing layer consists of only the photocatalyst may be a method using a vacuum film-forming method such as sputtering, CVD or vacuum vapor deposition. According to the formation by the vacuum film-forming method, it is possible to form, as an even film, the photocatalyst processing layer which contains only the photocatalyst. In this way, the wettability change on the wettability changeable layer can be evenly varied. Since the layer is made only of the photocatalyst, the wettability on the wettability changeable layer can be more effectively changed in this case than in the case of using a binder also.

Another example of the method for forming the photocatalyst processing layer made only of a photocatalyst, is the following method: in the case that the photocatalyst is, for example, titanium dioxide, amorphous titania is formed on the base body and next fired so as to phase-change the titania to crystalline titania. The amorphous titania used in this case can be obtained, for example, by hydrolysis or dehydration condensation of an inorganic salt of titanium, such as titanium tetrachloride or titanium sulfate, or hydrolysis or dehydration condensation of an organic titanium compound, such as tetraethoxytitanium, tetraisopropoxytitanium, tetra-n-propoxytitanium, tetrabutoxytitanium or tetramethoxytitanium, in the presence of an acid. Next, the resultant is fired at 400° C. to 500° C. so as to be denatured to anatase type titania, and fired at 600° C. to 700° C. so as to be denatured to rutile type titania.

On the other hand, in the case of using a binder, the binder is preferably a compound having such a high bond energy that the main skeleton thereof is not decomposed by photoexcitation of the photocatalyst, and organopolysiloxane can be cited as an example.

In the case of using, as the binder, an organopolysiloxane, the photocatalyst processing layer can be formed by dispersing a photocatalyst, the organopolysiloxane as the binder, and optional other additives into a solvent to prepare a photocatalyst processing layer forming coating solution and then applying this solution onto a base body. As the solvent to be used, alcohol based organic solvents such as an ethanol and an isopropanol are preferable. The coating operation can be carried out by a known coating method such as spin coating, spray coating, dip coating, roll coating and bead coating. In the case an ultraviolet ray curable type component is contained as a binder, the photocatalyst processing layer can be formed with an execution of a cure process by irradiating an ultraviolet ray.

An amorphous silica can be presented as the binder. The precursor of the amorphous silica is represented by the general formula: $SiX_4$. X is preferably a silicon compound such as a halogen, a methoxy group, an ethoxy group, an acetyl group, a silanol as a hydrolysis product thereof, or a polysiloxane having a 3,000 or less average molecular weight. Specific example may be such as tetraethoxysilane, tetraisopropoxysilane, tetra-n-propoxysilane, tetrabutoxysilane or tetramethoxysilane.

In this case, the photocatalyst processing layer can be formed by dispersing the amorphous silica precursor and particles of the photocatalyst homogeneously into a non-aqueous solvent, hydrolyzing the dispersion with water content in the air to form silanol on a base body, and dehydrating and polycondensing the silanol at room temperature. When the silanol is dehydrated and polycondensed at 100° C. or higher, the polymerization degree of the silanol increases so that the strength of the film surface can be improved. These binders may be used alone or in the form of a mixture of two or more thereof.

In the case of using the binder(s), the content by percentage of the photocatalyst in the photocatalyst processing layer may be from 5 to 60% by weight, and is preferably from 20 to 40% by weight.

The thickness of the photocatalyst processing layer is preferably from 0.05 to 10 μm.

Besides the photocatalyst and the binder, a decomposition product may be incorporated into the photocatalyst processing layer.

For the photocatalyst, the binder, and the decomposition product, they are the same as those described in the column of "B. Patterning substrate 1. Wettability changeable layer" of the first embodiment. Thus the explanation is omitted here.

(Base Body)

The material which constitutes the base body used in the photocatalyst processing layer side substrate is appropriately selected in accordance with the direction of energy irradiation, the matter as to whether or not transparency is necessary for the pattern formed body to be yielded, or other factors.

The base body used in the embodiment may be a member having flexibility, such as a resin film, or may be a member having no flexibility, such as a glass plate. This is appropriately selected in accordance with the method for the energy irradiation.

An anchor layer may be formed on the base body in order to improve the adhesive property between the base body surface and the photocatalyst processing layer. The anchor layer may be made of, for example, a silane-based or titanium-based coupling agent.

(Photocatalyst Processing Layer Side Light Shielding Part)

The photocatalyst processing layer side substrate may be a photocatalyst processing layer side substrate on which the photocatalyst processing layer side light shielding part may be formed into a pattern form. When the photocatalyst processing layer side substrate having the photocatalyst processing layer side light shielding part is used in this way, it is unnecessary to use, at the time of irradiating energy, any photomask or to irradiate a laser ray for drawing irradiation. It is therefore unnecessary to position a photomask precisely onto the photocatalyst processing layer side substrate. Consequently, it can be a simple step and also it is unnecessary to use any expensive device for drawing irradiation, thereby producing an advantage for costs.

Such a photocatalyst processing layer side substrate having the photocatalyst processing layer side light shielding part can be classified into the following two embodiments, depending on the position where the photocatalyst processing layer light shielding part is formed.

One of them is an embodiment wherein the photocatalyst processing layer side light shielding part is formed on a base body and a photocatalyst processing layer is formed on the photocatalyst processing layer side light shielding part. The other example is an embodiment wherein a photocatalyst processing layer is formed on a base body and photocatalyst processing layer side light shielding part is formed on the layer.

In any one of the embodiments, the effect of energy-scattering in the base body or the like can be made smaller than in the case of using a photomask since the photocatalyst processing layer side light shielding part is arranged near the region where the photocatalyst processing layer and the wettability changeable layer are arranged. Accordingly, irradiation of energy in a pattern form can be very precisely attained.

In the invention, an embodiment wherein photocatalyst processing layer side light shielding part is formed on a photocatalyst processing layer has an advantage that at the time of arranging the photocatalyst processing layer and the wettability changeable layer in a given position, the film thickness of the light shielding part can be made consistent with the width of the interval between the two layers, thereby using the light shielding part as a spacer for making the interval constant.

In other words, when the photocatalyst processing layer and the wettability changeable layer are arranged so as to be facing each other at a given interval, the photocatalyst processing layer side light shielding part and the wettability changeable layer can be made closely adhesive to each other, thereby making the dimension of the given interval precise. When the resultant in this state is irradiated with energy, wettability changeable pattern can be formed with a good precision since no wettability in the wettability changeable layer changes inside the region where the light shielding part and the wettability changeable layer contact. At this time, the direction in which the energy is radiated is not limited to the direction from the front side of the base body, and may be, for example, the direction from a lateral face side of the base body.

The method for forming such photocatalyst processing layer side light shielding part is not particularly limited, and may be appropriately selected in accordance with the property of the face where the light shielding part is to be formed, power for shielding required energy, and others. As for the forming method of the photocatalyst processing layer side light shielding part, it is the same as the method of forming the light shielding part described in the first embodiment of the "B. Patterning substrate 1. wettability changeable layer." This, the explanation is omitted here.

The above has described the two cases, where the photocatalyst processing layer side light shielding part is positioned between the base body and the photocatalyst processing layer is positioned on the surface of the photocatalyst processing layer. Besides, the photocatalyst processing layer side light shielding part may be formed on the base body surface on which the photocatalyst processing layer is not formed. In this embodiment, for example, a photomask may be caused to adhere onto this surface to such a degree that the photomask can be put on and taken off. Thus, this case can be preferably used in the case of changing the wettability change pattern for every small lot.

(3) Others

For the producing method of the pattern formed body of the present embodiment, as needs arise, other steps may be included apart from the wettability inhibition part forming step, wettability changeable layer forming step, energy directing step and the examining step.

F. Producing Method of the Functional Element

Next, the producing method of the functional element for the present invention will be explained. The producing method of the functional element for the present invention comprising: a pattern formed body forming step using the method of producing a pattern formed body, and a functional part forming step of forming a functional part in a functional part formation region on the wettability changeable layer of the pattern formed body obtained in the pattern formed body forming step.

According to the present invention, as mentioned above since the contact angle with respect to a liquid in the lyophilic region of the wettability pattern can be optimized in the pattern formed body forming step, cost down can be enabled without waste of forming the functional part in a defect product.

Moreover, since the wettability changeable pattern with the wettability changed is formed in the above-mentioned pattern formed body, functional part forming step of forming the functional part can be easily conducted utilizing the wettability difference of the wettability changeable pattern.

As for the wording "functional", it is the same as the one described in the "C. Functional element."

The functional part forming coating solution used in the functional part forming process in the invention is largely varied in accordance with the kind of the functional element to be produced, the method for forming the element, and other factors. The coating solution may be, for example, a composition not diluted with any solvent, such as an ultraviolet curable monomer, a liquid composition diluted with a solvent, or the like. It is particularly preferred that the viscosity of the functional part forming coating solution is smaller since a pattern can be formed in a shorter time. In the case of a liquid composition diluted with a solvent, the viscosity is raised or the surface tension thereof is changed by the volatilization of the solvent at the time of forming a pattern. It is therefore desired that the solvent has a low volatility.

The functional part forming coating solution used in the invention may be a solution which is stuck and arranged onto the above-mentioned wettability changeable pattern, thereby turning into a functional part, or a solution which is arranged onto the wettability changeable pattern and then subjected to treatment with a chemical agent, ultraviolet rays, heat or the like, thereby turning into a functional part. In this case, it is preferred that the functional part forming coating solution contains, as a binder therefore, a component curable by ultraviolet rays, heat, an electron beam, or the like since a functional part can be rapidly formed by curing treatment.

The functional part forming process in the invention is preferably performed by a nozzle jetting-out method such as a method using ink-jetting, electric field jetting or a dispenser, or some other method. The use of the method makes it possible to form a functional part evenly and highly precisely.

The producing method of the functional element for the present invention is, in particular, a method for manufacturing an organic EL element in which its functional part is an organic EL layer, a method for manufacturing a color filter in which its functional part is a colored layer, and a method for manufacturing an conductive pattern in which its functional part is metallic wiring. This is because the functional parts of these functional elements can easily be formed using a wettability difference of the above-mentioned pattern formed body.

G. Producing Method of the Organic EL Element

Next, the producing method of the organic EL element will be explained. A method of producing an organic EL element using the method of producing a functional element of the present invention, wherein the functional part forming step in the method of producing a functional element is an organic EL layer forming step of forming an organic EL layer having at least a light emitting layer.

According to the present invention, since the method of producing the functional element is used, the yield can be improved. Moreover, the organic EL layer can be easily painted differently utilizing the wettability difference of the wettability changeable pattern of the pattern formed body mentioned above so that an organic EL element with a highly precise organic EL layer formed can be produced.

The method for forming each of the members and so on used for the organic EL element of the present invention may be the same as about ordinary organic EL element. Thus, description is omitted herein.

The present invention is not limited to the embodiments. The embodiments are merely examples, and any one having the substantially same configuration as the technological idea disclosed in the claims of the present invention and the same effects is included in the technological scope of the present invention.

EXAMPLES

Hereinafter, the present invention will be explained in detail with reference to the examples.

Example 1

An ITO film was formed and patterned on a 150 mm square glass substrate to form a transparent electrode layer and a wettability inhibition examining part in a stripe pattern. At the time, the wettability inhibition examining part was provided in a part of the functional part non formation region so as to provide a contact angle measuring region. By applying with a spin coater and drying a wettability changeable layer forming coating solution made of an isopropyl alcohol solution of a fluoro alkyl alkoxy silane and a titania sol solution onto the substrate with the above-mentioned transparent electrode layer and the wettability inhibition examining part formed, a wettability changeable layer was formed so as to have a 70 nm film thickness. Next, by the UV irradiation via a pattern mask, a wettability changeable pattern was formed on the surface of the wettability changeable layer, and at the same time, the UV irradiation was carried out also for the wettability changeable layer in the contact angle measuring region. In this state, the wettability change cannot be observed visually.

By dropping pure water onto the wettability changeable layer in the contact angle measuring region and measuring the contact angle with respect to the pure water, it was confirmed to be 5° or less.

An ink was applied by the ink jet method to the UV irradiated region other than the contact angle measuring region of the wettability changeable layer of the pattern formed body accordingly obtained so as to be spread preferably. Thereby, it was confirmed that a pattern formed body having a wettability changeable pattern including the liquid repellent region and the lyophilic region, capable of patterning the various functional parts was obtained.

Example 2

As shown in FIG. 6, a transparent electrode layer (ITO film) 41 was formed in a pattern and patterned on a 150 mm square glass substrate 1 to form an insulation layer 42 (TFR-H manufactured by TOKYO OHKA KOGYO CO., LTD., positive type photosensitive resin) was formed to cover the end part of the ITO film 41. At the time, by forming the ITO film 41 and the insulation layer 42 not only in the functional part formation region 11 but also in the functional part non formation region 12, the contact angle measuring region 2 was provided. By applying with a spin coater and drying a wettability changeable layer forming coating solution made of an isopropyl alcohol solution of a fluoroalkyl alkoxy silane and a titania sol solution onto the glass substrate 1 with the above-mentioned transparent electrode layer 41 and the insulation layer 42 formed, a wettability changeable layer 5 was formed so as to have a 70 nm film thickness. Furthermore, by the UV irradiation via a pattern mask, a wettability changeable pattern including the lyophilic regions 13, 13' and the liquid repellent region 14 was formed on the wettability changeable layer 5. At the time, the UV irradiation was carried out until the contact angle with respect to pure water in the surface of the wettability changeable layer 5 on the transparent electrode layer 41 in the contact angle measuring region 2 and the surface of the wettability changeable layer 5 on the insulation layer 42 becomes 5° or less.

An organic EL element was produced using the pattern formed body accordingly obtained so that short circuit between the electrodes can be prevented without the problems of having a film thickness of the light emitting layer thinner than the targeted film thickness or failure of the light emitting layer formation, or the like.

What is claimed is:

1. A pattern formed body comprising:
a substrate for pattern formation and a wettability changeable layer, wherein the substrate for pattern formation comprises:
a base material,
a wettability inhibition part formed in a functional part formation region on the base material, and
a wettability inhibition examining part formed in a contact angle measuring region provided in a functional part non formation region on the base material,
wherein the wettability changeable layer is formed on the wettability inhibition part and the wettability inhibition examining part of the substrate for pattern formation so as to have a wettability change by an action of a photocatalyst accompanied by an energy irradiation,
wherein the pattern formed body further comprises a wettability changeable pattern comprising a lyophilic region and a liquid repellant region formed by directing the energy to the wettability changeable layer,
wherein same constituent materials are used for the wettability inhibition part and the wettability inhibition examining part,
wherein the functional part formation region comprises a region with the wettability inhibition part formed and a region with no wettability inhibition part formed, and the wettability changeable layer in the functional part formation region further comprises a lyophilic region and a liquid repellant region, and
wherein the contact angle measuring region comprises a region with the wettability inhibition examining part formed and a region with no wettability inhibition examining part formed and the wettability changeable layer in the contact angle measuring region comprises only a lyophilic region.

2. The pattern formed body according to claim 1, wherein the wettability changeable layer contains an organopolysiloxane.

3. The pattern formed body according to claim 1, wherein the wettability changeable layer contains the photocatalyst.

4. A functional element comprising the pattern formed body according to claim 1, and the functional part formed in the functional part formation region on the wettability changeable layer of the pattern formed body.

5. An organic electroluminescent element, wherein the functional part of the functional element according to claim 4 is an organic electroluminescent layer comprising at least a light emitting layer.

6. The organic electroluminescent element according to claim 5, wherein the wettability inhibition part and the wettability inhibition examining part include an insulation layer.

* * * * *